US011709544B2

(12) United States Patent
Woods

(10) Patent No.: US 11,709,544 B2
(45) Date of Patent: *Jul. 25, 2023

(54) POSE ESTIMATION USING ELECTROMAGNETIC TRACKING

(71) Applicant: Magic Leap, Inc., Plantation, FL (US)

(72) Inventor: Michael Janusz Woods, Mountain View, CA (US)

(73) Assignee: Magic Leap, Inc., Plantation, FL (US)

( * ) Notice: Subject to any disclaimer, the term of this patent is extended or adjusted under 35 U.S.C. 154(b) by 213 days.

This patent is subject to a terminal disclaimer.

(21) Appl. No.: 17/137,239

(22) Filed: Dec. 29, 2020

(65) Prior Publication Data

US 2021/0141448 A1    May 13, 2021

Related U.S. Application Data

(63) Continuation of application No. 16/032,927, filed on Jul. 11, 2018, now Pat. No. 10,908,680.

(Continued)

(51) Int. Cl.
 *G06K 9/00* (2022.01)
 *G06F 3/01* (2006.01)
(Continued)

(52) U.S. Cl.
 CPC .............. *G06F 3/012* (2013.01); *G01B 7/003* (2013.01); *G01R 33/0023* (2013.01);
(Continued)

(58) Field of Classification Search
 CPC ... G06F 3/012; G06F 3/0346; G01R 33/0023; G02B 27/0172; G02B 2027/0138; G02B 2027/0178; G01B 7/003; G06T 19/006
 See application file for complete search history.

(56) References Cited

U.S. PATENT DOCUMENTS 3,983,474 A   9/1976   Kuipers
4,054,881 A   10/1977  Raab
(Continued)

OTHER PUBLICATIONS

ARToolKit: https://web.archive.org/web/20051013062315/http://www.hitl.washington.edu:80/artoolkit/documentation/hardware.htm, archived Oct. 13, 2005.
(Continued)

*Primary Examiner* — Tom Y Lu
(74) *Attorney, Agent, or Firm* — Tobias Intellectual Property Law, PLLC

(57) ABSTRACT

Head-mounted augmented reality (AR) devices can track pose of a wearer's head to provide a three-dimensional virtual representation of objects in the wearer's environment. An electromagnetic (EM) tracking system can track head or body pose. A handheld user input device can include an EM emitter that generates an EM field, and the head-mounted AR device can include an EM sensor that senses the EM field. EM information from the sensor can be analyzed to determine location and/or orientation of the sensor and thereby the wearer's pose. An improved or optimized pose can be provided by reverse-estimating a reverse EM measurement matrix and optimizing the pose based on a comparison between the reverse EM measurement matrix and an EM measurement matrix measured by the EM sensor.

18 Claims, 22 Drawing Sheets

Related U.S. Application Data

(60) Provisional application No. 62/531,840, filed on Jul. 12, 2017.

(51) Int. Cl.
*G01R 33/00* (2006.01)
*G01B 7/00* (2006.01)
*G06F 3/0346* (2013.01)
*G06T 19/00* (2011.01)
*G02B 27/01* (2006.01)

(52) U.S. Cl.
CPC ....... *G02B 27/0172* (2013.01); *G06F 3/0346* (2013.01); *G06T 19/006* (2013.01); *G02B 2027/0138* (2013.01); *G02B 2027/0178* (2013.01)

(56) References Cited

U.S. PATENT DOCUMENTS

| | | | |
|---|---|---|---|
| 4,742,356 A | 5/1988 | Kuipers | |
| 5,847,976 A | 12/1998 | Lescourret | |
| 6,774,624 B2 | 8/2004 | Anderson et al. | |
| 6,850,221 B1 | 2/2005 | Tickle | |
| 7,542,869 B2 | 6/2009 | Gandelsman et al. | |
| 8,700,376 B2 | 4/2014 | Ophir et al. | |
| 8,950,867 B2 | 2/2015 | Macnamara | |
| 9,081,426 B2 | 7/2015 | Armstrong | |
| 9,215,293 B2 | 12/2015 | Miller | |
| 9,310,559 B2 | 4/2016 | Macnamara | |
| 9,348,143 B2 | 5/2016 | Gao et al. | |
| D758,367 S | 6/2016 | Natsume | |
| 9,417,452 B2 | 8/2016 | Schowengerdt et al. | |
| 9,671,566 B2 | 6/2017 | Abovitz et al. | |
| 9,791,700 B2 | 10/2017 | Schowengerdt et al. | |
| 9,874,749 B2 | 1/2018 | Bradski | |
| 10,908,680 B1 * | 2/2021 | Woods | G02B 27/017 |
| 2002/0030483 A1 | 3/2002 | Gilboa | |
| 2006/0028436 A1 | 2/2006 | Armstrong | |
| 2007/0081123 A1 | 4/2007 | Lewis | |
| 2012/0127062 A1 | 5/2012 | Bar-Zeev et al. | |
| 2012/0162549 A1 | 6/2012 | Gao et al. | |
| 2013/0082922 A1 | 4/2013 | Miller | |
| 2013/0117377 A1 | 5/2013 | Miller | |
| 2013/0125027 A1 | 5/2013 | Abovitz | |
| 2013/0208234 A1 | 8/2013 | Lewis | |
| 2013/0242262 A1 | 9/2013 | Lewis | |
| 2014/0071539 A1 | 3/2014 | Gao | |
| 2014/0177023 A1 | 6/2014 | Gao et al. | |
| 2014/0218468 A1 | 8/2014 | Gao et al. | |
| 2014/0267420 A1 | 9/2014 | Schowengerdt | |
| 2014/0306866 A1 | 10/2014 | Miller et al. | |
| 2015/0016777 A1 | 1/2015 | Abovitz et al. | |
| 2015/0103306 A1 | 4/2015 | Kaji et al. | |
| 2015/0178939 A1 | 6/2015 | Bradski et al. | |
| 2015/0205126 A1 | 7/2015 | Schowengerdt | |
| 2015/0222883 A1 | 8/2015 | Welch | |
| 2015/0222884 A1 | 8/2015 | Cheng | |
| 2015/0268415 A1 | 9/2015 | Schowengerdt et al. | |
| 2015/0302652 A1 | 10/2015 | Miller et al. | |
| 2015/0309263 A2 | 10/2015 | Abovitz et al. | |
| 2015/0326570 A1 | 11/2015 | Publicover et al. | |
| 2015/0346490 A1 | 12/2015 | TeKolste et al. | |
| 2015/0346495 A1 | 12/2015 | Welch et al. | |
| 2016/0011419 A1 | 1/2016 | Gao | |
| 2016/0026253 A1 | 1/2016 | Bradski et al. | |
| 2016/0259404 A1 | 9/2016 | Woods | |
| 2017/0307891 A1 | 10/2017 | Bucknor et al. | |
| 2018/0053056 A1 | 2/2018 | Rabinovich et al. | |
| 2018/0239144 A1 | 8/2018 | Woods et al. | |
| 2018/0314346 A1 | 11/2018 | Kirmani et al. | |

OTHER PUBLICATIONS

Azuma, "A Survey of Augmented Reality," Teleoperators and Virtual Environments 6, 4 (Aug. 1997), pp. 355-385. https://web.archive.org/web/20010604100006/http://www.cs.unc.edu/~azuma/ARpresence.pdf.

Azuma, "Predictive Tracking for Augmented Realty," TR95-007, Department of Computer Science, UNC-Chapel Hill, NC, Feb. 1995.

Bimber, et al., "Spatial Augmented Reality—Merging Real and Virtual Worlds," 2005 https://web.media.mit.edu/~raskar/book/BimberRaskarAugmentedRealityBook.pdf.

Jacob, "Eye Tracking in Advanced Interface Design," Human-Computer Interaction Lab Naval Research Laboratory, Washington, D.C. / paper/ in Virtual Environments and Advanced Interface Design, ed. by W. Barfield and T.A. Furness, pp. 258-288, Oxford University Press, New York (1995).

Kuipers: "Quaternions And Rotation Sequences," Geometry, Integrability and Quantization, Sep. 1-10, 1999, Varna, Bulgaria, Sofia 2000, pp. 127-143.

Tanriverdi and Jacob, "Interacting With Eye Movements in Virtual Environments," Department of Electrical Engineering and Computer Science, Tufts University, Medford, MA—paper/Proc. ACM CHI 2000 Human Factors in Computing Systems Conference, pp. 265-272, Addison-Wesley/ACM Press (2000).

* cited by examiner

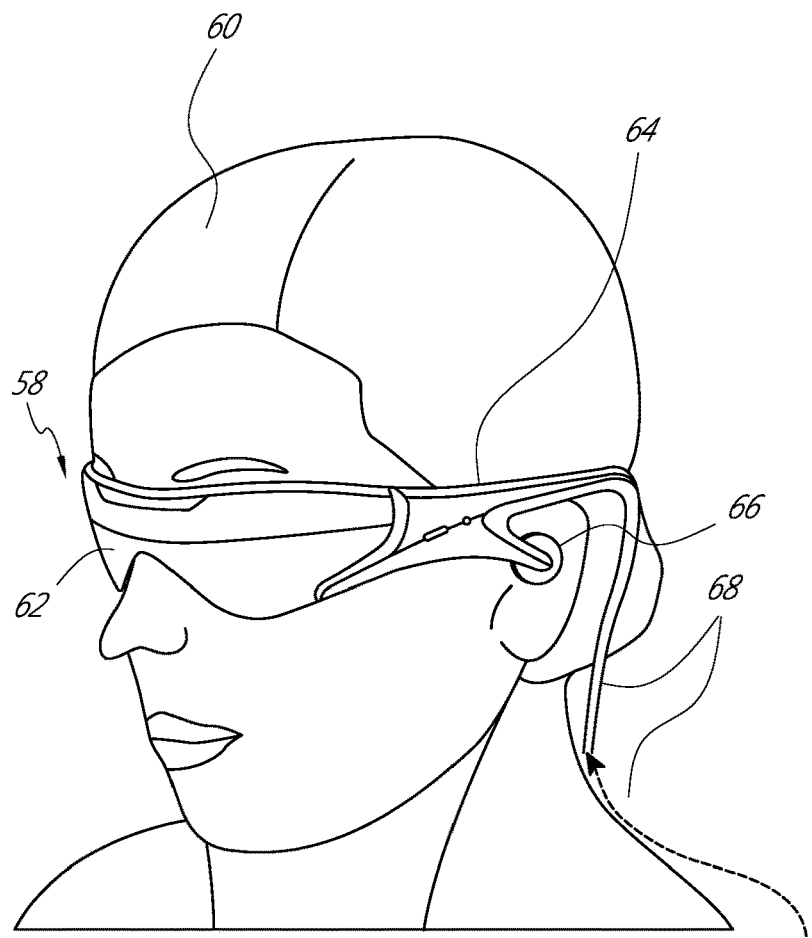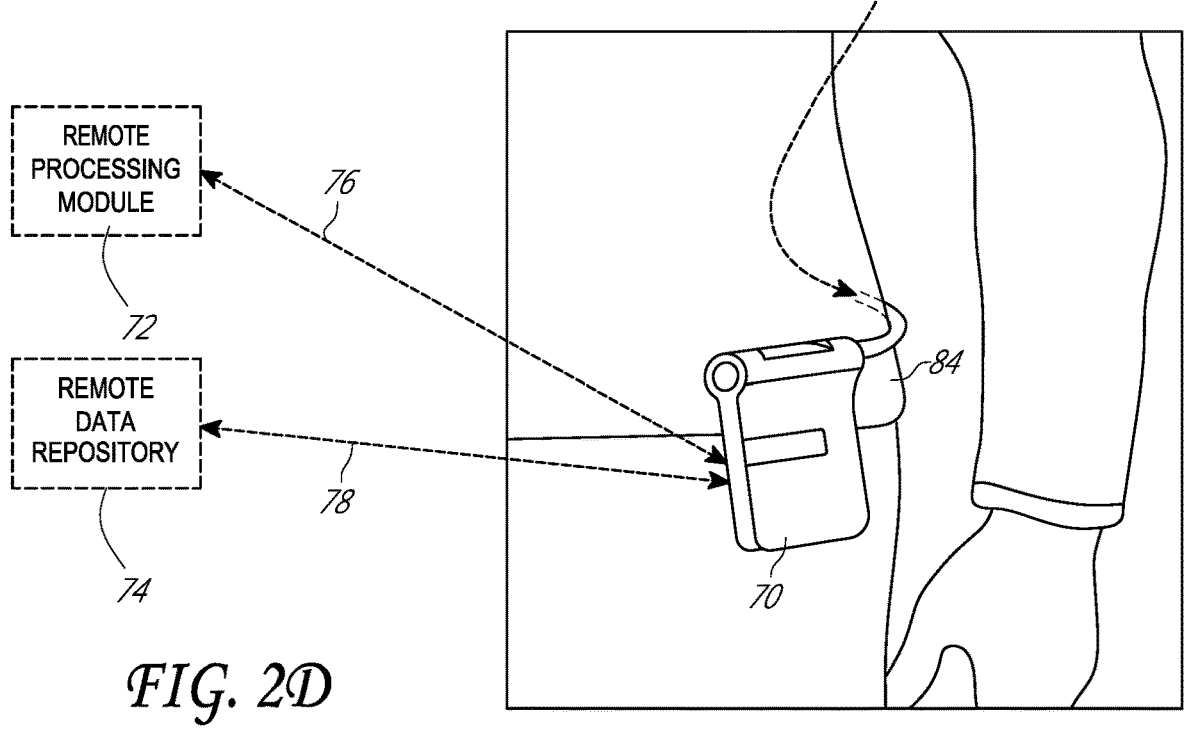
FIG. 2D

POSE ESTIMATION USING ELECTROMAGNETIC TRACKING

CROSS-REFERENCE TO RELATED APPLICATIONS

This application is a continuation application of U.S. patent application Ser. No. 16/032,927, filed Jul. 11, 2018, entitled POSE ESTIMATION USING ELECTROMAGNETIC TRACKING, which claims the benefit of priority to U.S. Patent Application No. 62/531,840, filed Jul. 12, 2017, entitled SYSTEMS AND METHODS FOR AUGMENTED REALITY, each of which is hereby incorporated by reference herein in its entirety.

BACKGROUND

Field

The present disclosure relates generally to systems and methods to determine position or orientation of an object using electromagnetic tracking and more particularly to pose estimation by electromagnetic tracking in the context of augmented reality systems.

Modern computing and display technologies have facilitated the development of systems for so called "virtual reality" or "augmented reality" experiences, wherein digitally reproduced images or portions thereof are presented to a user in a manner wherein they seem to be, or may be perceived as, real. A virtual reality, or "VR", scenario typically involves presentation of digital or virtual image information without transparency to other actual real-world visual input; an augmented reality, or "AR", scenario typically involves presentation of digital or virtual image information as an augmentation to visualization of the actual world around the user.

SUMMARY

Head-mounted augmented reality (AR) devices can track the pose of the wearer's head (or other body part) to be able to provide a three-dimensional virtual representation of objects in the wearer's environment. Embodiments of an electromagnetic (EM) tracking system can be used to track head pose or body gestures. For example, a handheld user input device can include an EM emitter and the head-mounted AR device can include an EM sensor. In some implementations, the EM emitter generates an EM field that can be sensed by the EM sensor. EM information from the sensor can be analyzed to determine location and/or orientation of the sensor and thereby the wearer's head pose. The pose can be a six degree-of-freedom (6DOF) pose comprising three spatial coordinates and three angular coordinates.

An embodiment of a head-mounted display system comprises a display positionable in front of eyes of a wearer; an electromagnetic (EM) field emitter configured to generate a magnetic field having a frequency; an EM sensor configured to sense the magnetic field at the frequency; and a processor programmed to: receive signals from the EM sensor indicative of a sensed magnetic field; and analyze the received signals to determine a position or an orientation of the EM sensor. The head-mounted display system can include a reverse sensor data generator to provide an improved or optimized pose. An improved or optimized pose can be provided by reverse-estimating a reverse EM measurement matrix (e.g., from a pose determined from EM sensor data) and optimizing the pose based on a comparison between the reverse EM measurement matrix and an EM measurement matrix measured by the EM sensor.

The pose can be optimized as additional sensor data is received (for example, during tracking of the pose of a user's head or body). In embodiments of this sequential technique, the output pose generated at a first time is used as an input, together with additional EM sensor data, to a poser optimizer (which may utilize the reverse estimation techniques) to generate a subsequent pose of the object.

The pose optimization and sequential pose generation techniques are not limited to AR or VR applications and in other implementations can be applied to EM tracking of any object.

Details of one or more implementations of the subject matter described in this specification are set forth in the accompanying drawings and the description below. Other features, aspects, and advantages will become apparent from the description, the drawings, and the claims. Neither this summary nor the following detailed description purports to define or limit the scope of the inventive subject matter.

BRIEF DESCRIPTION OF THE DRAWINGS

FIGS. 2A-2D schematically illustrate examples of a wearable system.

Throughout the drawings, reference numbers may be re-used to indicate correspondence between referenced elements. The drawings are provided to illustrate example embodiments described herein and are not intended to limit the scope of the disclosure.

DETAILED DESCRIPTION

Overview of AR, VR and Localization Systems

Figure 1:
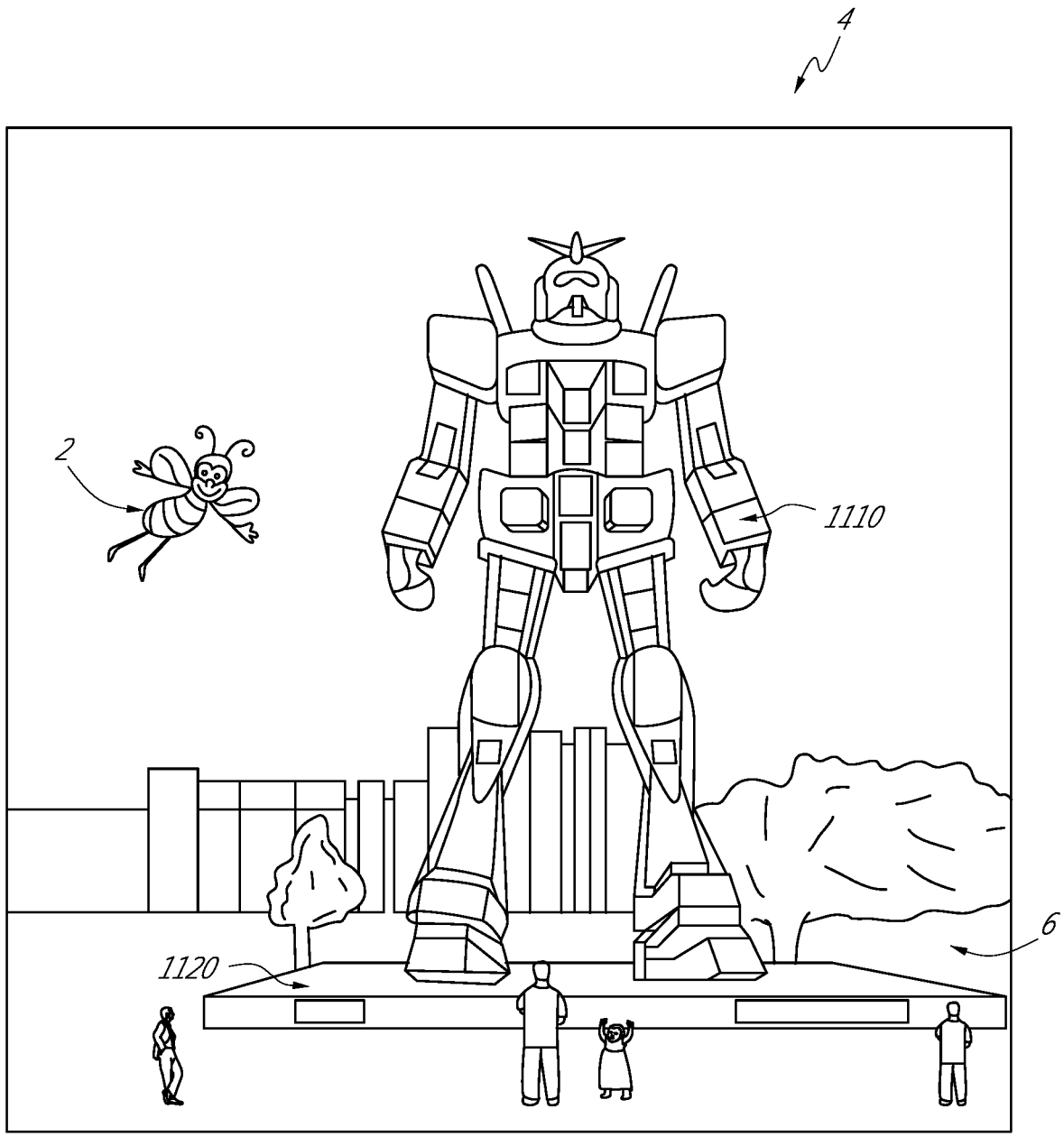
FIG. 1 depicts an illustration of an augmented reality scenario with certain virtual reality objects, and certain physical objects viewed by a person.

In FIG. 1 an augmented reality scene (4) is depicted wherein a user of an AR technology sees a real-world park-like setting (6) featuring people, trees, buildings in the background, and a concrete platform (1120). In addition to these items, the user of the AR technology also perceives that he "sees" a robot statue (1110) standing upon the real-world platform (1120), and a cartoon-like avatar character (2) flying by which seems to be a personification of a bumble bee, even though these elements (2, 1110) do not exist in the real world. As it turns out, the human visual perception system is very complex, and producing a VR or AR technology that facilitates a comfortable, natural-feeling, rich presentation of virtual image elements amongst other virtual or real-world imagery elements is challenging.

For instance, head-worn AR displays (or helmet-mounted displays, or smart glasses) typically are at least loosely coupled to a user's head, and thus move when the user's head moves. If the user's head motions are detected by the display system, the data being displayed can be updated to take the change in head pose into account.

As an example, if a user wearing a head-worn display views a virtual representation of a three-dimensional (3D) object on the display and walks around the area where the 3D object appears, that 3D object can be re-rendered for each viewpoint, giving the user the perception that he or she is walking around an object that occupies real space. If the head-worn display is used to present multiple objects within a virtual space (for instance, a rich virtual world), measurements of head pose (e.g., the location and orientation of the user's head) can be used to re-render the scene to match the user's dynamically changing head location and orientation and provide an increased sense of immersion in the virtual space.

In AR systems, detection or calculation of head pose can facilitate the display system to render virtual objects such that they appear to occupy a space in the real world in a manner that makes sense to the user. In addition, detection of the position and/or orientation of a real object, such as handheld device (which also may be referred to as a "totem"), haptic device, or other real physical object, in relation to the user's head or AR system may also facilitate the display system in presenting display information to the user to enable the user to interact with certain aspects of the AR system efficiently. As the user's head moves around in the real world, the virtual objects may be re-rendered as a function of head pose, such that the virtual objects appear to remain stable relative to the real world. At least for AR applications, placement of virtual objects in spatial relation to physical objects (e.g., presented to appear spatially proximate a physical object in two- or three-dimensions) may be a non-trivial problem. For example, head movement may significantly complicate placement of virtual objects in a view of an ambient environment. Such is true whether the view is captured as an image of the ambient environment and then projected or displayed to the end user, or whether the end user perceives the view of the ambient environment directly. For instance, head movement will likely cause a field of view of the end user to change, which will likely require an update to where various virtual objects are displayed in the field of the view of the end user. Additionally, head movements may occur within a large variety of ranges and speeds. Head movement speed may vary not only between different head movements, but within or across the range of a single head movement. For instance, head movement speed may initially increase (e.g., linearly or not) from a starting point, and may decrease as an ending point is reached, obtaining a maximum speed somewhere between the starting and ending points of the head movement. Rapid head movements may even exceed the ability of the particular display or projection technology to render images that appear uniform and/or as smooth motion to the end user.

Head tracking accuracy and latency (e.g., the elapsed time between when the user moves his or her head and the time when the image gets updated and displayed to the user) have been challenges for VR and AR systems. Especially for display systems that fill a substantial portion of the user's visual field with virtual elements, it is advantageous if the accuracy of head-tracking is high and that the overall system latency is very low from the first detection of head motion to the updating of the light that is delivered by the display to the user's visual system. If the latency is high, the system can create a mismatch between the user's vestibular and visual sensory systems, and generate a user perception scenario that can lead to motion sickness or simulator sickness. If the system latency is high, the apparent location of virtual objects will appear unstable during rapid head motions.

In addition to head-worn display systems, other display systems can benefit from accurate and low latency head pose detection. These include head-tracked display systems in which the display is not worn on the user's body, but is, e.g., mounted on a wall or other surface. The head-tracked display acts like a window onto a scene, and as a user moves his head relative to the "window" the scene is re-rendered to match the user's changing viewpoint. Other systems include a head-worn projection system, in which a head-worn display projects light onto the real world.

Additionally, in order to provide a realistic augmented reality experience, AR systems may be designed to be interactive with the user. For example, multiple users may play a ball game with a virtual ball and/or other virtual objects. One user may "catch" the virtual ball, and throw the ball back to another user. In another embodiment, a first user may be provided with a totem (e.g., a real bat communicatively coupled to the AR system) to hit the virtual ball. In other embodiments, a virtual user interface may be presented to the AR user to allow the user to select one of many options. The user may use totems, haptic devices, wearable components, or simply touch the virtual screen to interact with the system.

Detecting head pose and orientation of the user, and detecting a physical location of real objects in space enable the AR system to display virtual content in an effective and enjoyable manner. However, although these capabilities are key to an AR system, but are difficult to achieve. In other words, the AR system can recognize a physical location of a real object (e.g., user's head, totem, haptic device, wearable component, user's hand, etc.) and correlate the physical coordinates of the real object to virtual coordinates corresponding to one or more virtual objects being displayed to the user. This generally requires highly accurate sensors and sensor recognition systems that track a position and orientation of one or more objects at rapid rates. Current approaches do not perform localization at satisfactory speed or precision standards.

Thus, there is a need for a better localization system in the context of AR and VR devices.

Example AR and VR Systems and Components

Referring to FIGS. 2A-2D, some general componentry options are illustrated. In the portions of the detailed description which follow the discussion of FIGS. 2A-2D, various systems, subsystems, and components are presented for addressing the objectives of providing a high-quality, comfortably-perceived display system for human VR and/or AR.

Figure 2A:
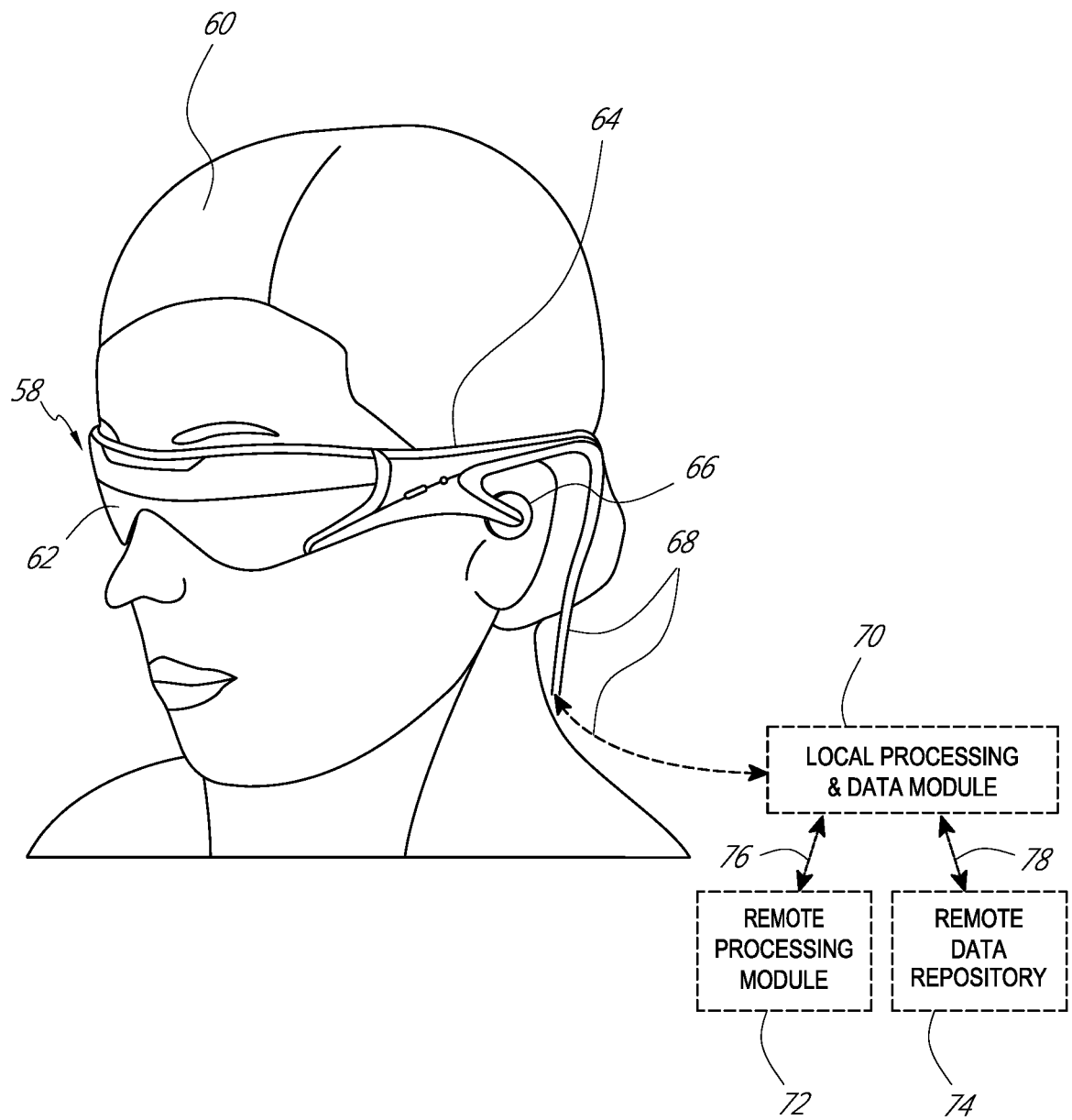
Figure 2B:
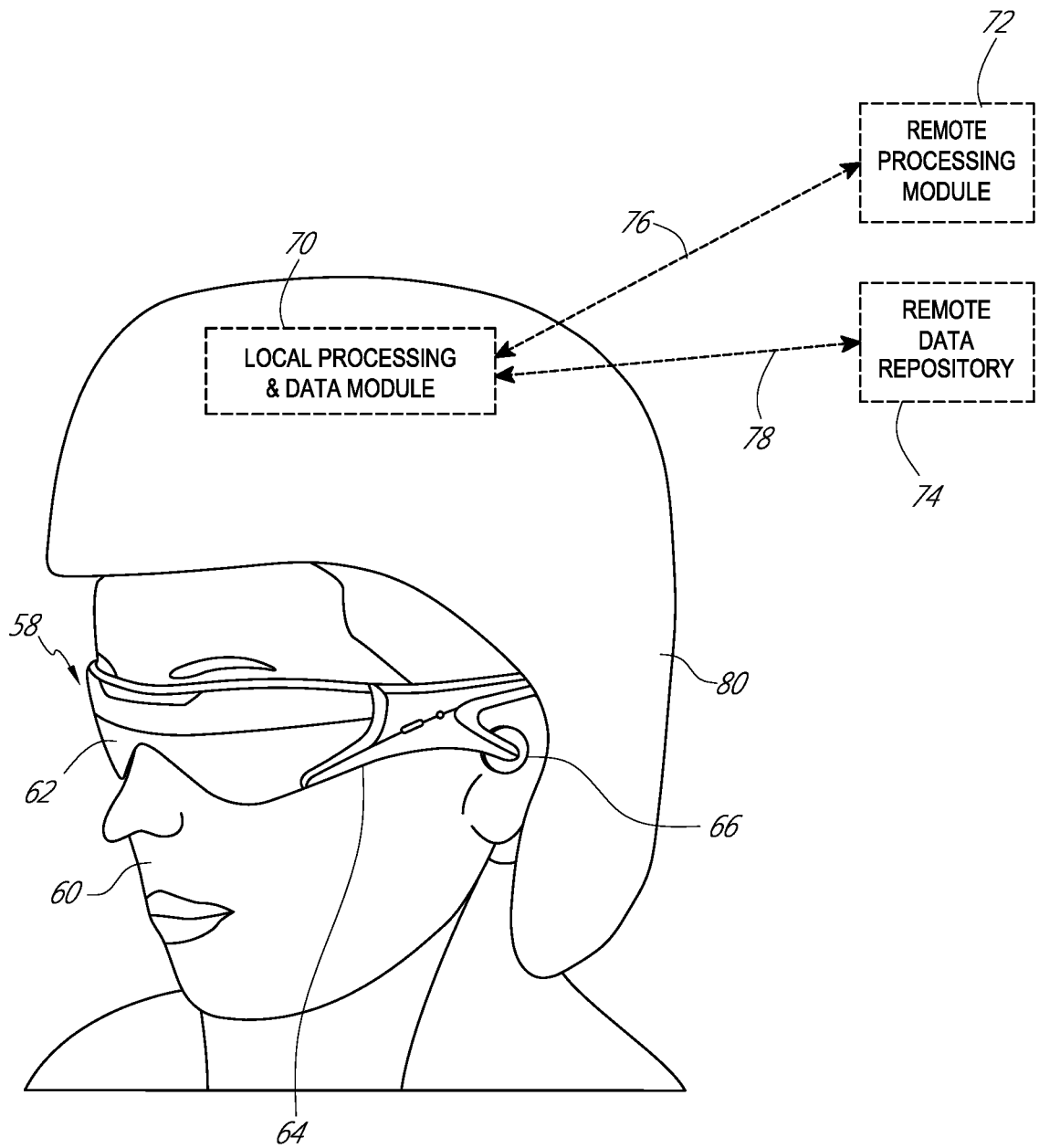
Figure 2C:
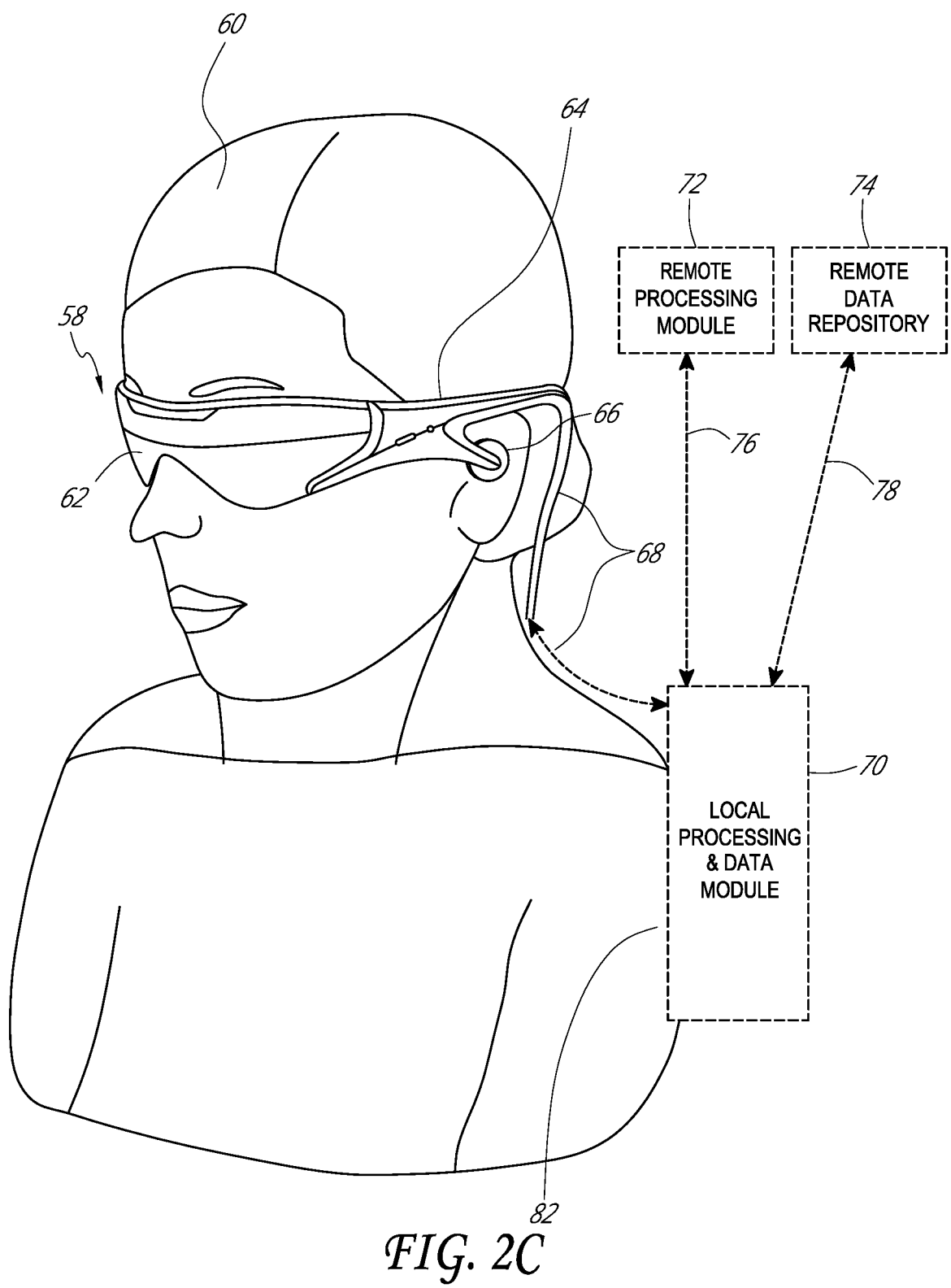

As shown in FIG. 2A, an AR system user (60) is depicted wearing head mounted component (58) featuring a frame (64) structure coupled to a display system (62) positioned in front of the eyes of the user. A speaker (66) is coupled to the frame (64) in the depicted configuration and positioned adjacent the ear canal of the user (in one embodiment, another speaker, not shown, is positioned adjacent the other ear canal of the user to provide for stereo/shapeable sound control). The display (62) is operatively coupled (68), such as by a wired lead or wireless connectivity, to a local processing and data module (70) which may be mounted in a variety of configurations, such as fixedly attached to the frame (64), fixedly attached to a helmet or hat (80) as shown in the embodiment of FIG. 2B, embedded in headphones, removably attached to the torso (82) of the user (60) in a backpack-style configuration as shown in the embodiment of FIG. 2C, or removably attached to the hip (84) of the user (60) in a belt-coupling style configuration as shown in the embodiment of FIG. 2D.

The local processing and data module (70) may comprise a power-efficient processor or controller, as well as digital memory, such as flash memory, both of which may be utilized to assist in the processing, caching, and storage of data a) captured from sensors which may be operatively coupled to the frame (64), such as image capture devices (such as cameras), microphones, inertial measurement units, accelerometers, compasses, GPS units, radio devices, and/or gyros; and/or b) acquired and/or processed using the remote processing module (72) and/or remote data repository (74), possibly for passage to the display (62) after such processing or retrieval. The local processing and data module (70) may be operatively coupled (76, 78), such as via a wired or wireless communication links, to the remote processing module (72) and remote data repository (74) such that these remote modules (72, 74) are operatively coupled to each other and available as resources to the local processing and data module (70).

In one embodiment, the remote processing module (72) may comprise one or more relatively powerful processors or controllers configured to analyze and process data and/or image information. In one embodiment, the remote data repository (74) may comprise a relatively large-scale digital data storage facility, which may be available through the internet or other networking configuration in a "cloud" resource configuration. In one embodiment, all data is stored and all computation is performed in the local processing and data module, allowing fully autonomous use from any remote modules.

Figure 3:
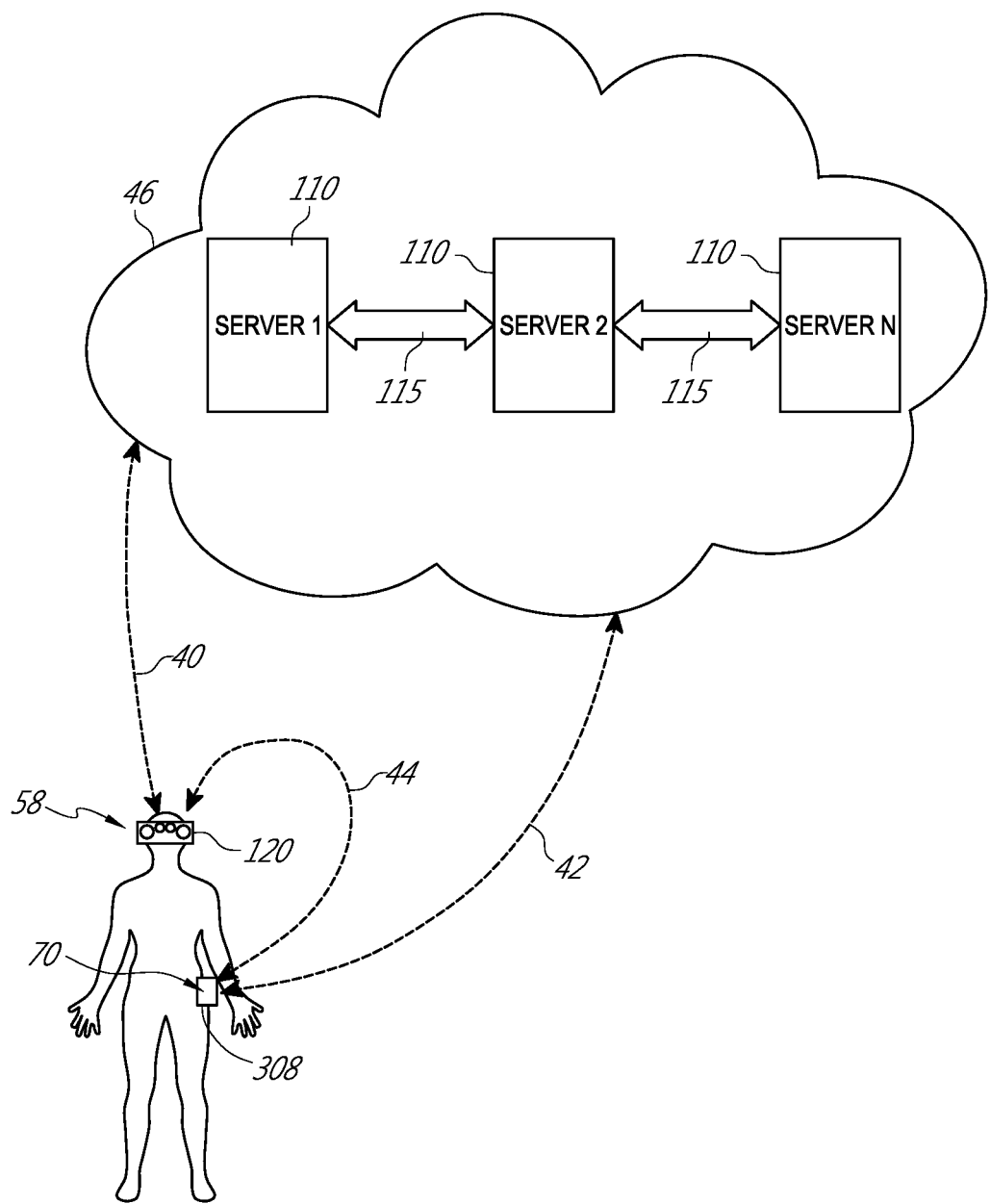
FIG. 3 schematically illustrates coordination between cloud computing assets and local processing assets.

Referring now to FIG. 3, a schematic illustrates coordination between the cloud computing assets (46) and local processing assets, which may, for example reside in head mounted componentry (58) coupled to the user's head (120) and a local processing and data module (70), coupled to the user's belt (308; therefore the component 70 may also be termed a "belt pack" 70), as shown in FIG. 3. In one embodiment, the cloud (46) assets, such as one or more server systems (110) are operatively coupled (115), such as via wired or wireless networking (wireless being preferred for mobility, wired being preferred for certain high-bandwidth or high-data-volume transfers that may be desired), directly to (40, 42) one or both of the local computing assets, such as processor and memory configurations, coupled to the user's head (120) and belt (308) as described above. These computing assets local to the user may be operatively coupled to each other as well, via wired and/or wireless connectivity configurations (44), such as the wired coupling (68) discussed below in reference to FIG. 8. In one embodiment, to maintain a low-inertia and small-size subsystem mounted to the user's head (120), primary transfer between the user and the cloud (46) may be via the link between the subsystem mounted at the belt (308) and the cloud, with the head mounted (120) subsystem primarily data-tethered to the belt-based (308) subsystem using wireless connectivity, such as ultra-wideband ("UWB") connectivity, as is currently employed, for example, in personal computing peripheral connectivity applications.

With efficient local and remote processing coordination, and an appropriate display device for a user, such as the user interface or user display system (62) shown in FIG. 2A, or variations thereof, aspects of one world pertinent to a user's current actual or virtual location may be transferred or "passed" to the user and updated in an efficient fashion. In other words, a map of the world may be continually updated at a storage location which may partially reside on the user's AR system and partially reside in the cloud resources. The map (also referred to as a "passable world model") may be a large database comprising raster imagery, 3-D and 2-D points, parametric information and other information about the real world. As more and more AR users continually capture information about their real environment (e.g., through cameras, sensors, IMUs, etc.), the map becomes more and more accurate and complete.

With a configuration as described above, wherein there is one world model that can reside on cloud computing resources and be distributed from there, such world can be "passable" to one or more users in a relatively low bandwidth form preferable to trying to pass around real-time video data or the like. The augmented experience of the person standing near the statue (e.g., as shown in FIG. 1) may be informed by the cloud-based world model, a subset of which may be passed down to them and their local display device to complete the view. A person sitting at a remote display device, which may be as simple as a personal computer sitting on a desk, can efficiently download that same section of information from the cloud and have it rendered on their display. Indeed, one person actually present in the park near the statue may take a remotely-located friend for a walk in that park, with the friend joining through virtual and augmented reality. The system will need to know where the street is, wherein the trees are, where the statue is—but with that information on the cloud, the joining friend can download from the cloud aspects of the scenario, and then start walking along as an augmented reality local relative to the person who is actually in the park.

Three-dimensional (3-D) points may be captured from the environment, and the pose (e.g., vector and/or origin position information relative to the world) of the cameras that capture those images or points may be determined, so that these points or images may be "tagged", or associated, with this pose information. Then points captured by a second camera may be utilized to determine the pose of the second camera. In other words, one can orient and/or localize a second camera based upon comparisons with tagged images from a first camera. Then this knowledge may be utilized to extract textures, make maps, and create a virtual copy of the real world (because then there are two cameras around that are registered).

So at the base level, in one embodiment a person-worn system can be utilized to capture both 3-D points and the 2-D images that produced the points, and these points and images may be sent out to a cloud storage and processing resource. They may also be cached locally with embedded pose information (e.g., cache the tagged images); so the cloud may have on the ready (e.g., in available cache) tagged 2-D images (e.g., tagged with a 3-D pose), along with 3-D points. If a user is observing something dynamic, he may also send additional information up to the cloud pertinent to the motion (for example, if looking at another person's face, the user can take a texture map of the face and push that up at an optimized frequency even though the surrounding world is otherwise basically static). More information on object recognizers and the passable world model may be found in U.S. Patent Pub. No. 2014/0306866, entitled "System and method for augmented and virtual reality", which is incorporated by reference in its entirety herein, along with the following additional disclosures, which related to augmented and virtual reality systems such as those developed by Magic Leap, Inc. of Plantation, Fla.: U.S. Patent Pub. No. 2015/0178939; U.S. Patent Pub. No. 2015/0205126; U.S. Patent Pub. No. 2014/0267420; U.S. Patent Pub. No. 2015/0302652; U.S. Patent Pub. No. 2013/0117377; and U.S. Patent Pub. No. 2013/0128230, each of which is hereby incorporated by reference herein in its entirety.

GPS and other localization information may be utilized as inputs to such processing. Highly accurate localization of the user's head, totems, hand gestures, haptic devices etc. may be advantageous in order to display appropriate virtual content to the user.

The head-mounted device (58) may include displays positionable in front of the eyes of the wearer of the device. The displays may comprise light field displays. The displays may be configured to present images to the wearer at a plurality of depth planes. The displays may comprise planar waveguides with diffraction elements. Examples of displays, head-mounted devices, and other AR components usable with any of the embodiments disclosed herein are described in U.S. Patent Publication No. 2015/0016777. U.S. Patent Publication No. 2015/0016777 is hereby incorporated by reference herein in its entirety.

Examples of Electromagnetic Localization

One approach to achieve high precision localization may involve the use of an electromagnetic (EM) field coupled with electromagnetic sensors that are strategically placed on the user's AR head set, belt pack, and/or other ancillary devices (e.g., totems, haptic devices, gaming instruments, etc.). Electromagnetic tracking systems typically comprise at least an electromagnetic field emitter and at least one electromagnetic field sensor. The electromagnetic field emitter generates an electromagnetic field having a known spatial (and/or temporal) distribution in the environment of wearer of the AR headset. The electromagnetic filed sensors measure the generated electromagnetic fields at the locations of the sensors. Based on these measurements and knowledge of the distribution of the generated electromagnetic field, a pose (e.g., a position and/or orientation) of a field sensor relative to the emitter can be determined. Accordingly, the pose of an object to which the sensor is attached can be determined.

Figure 4:
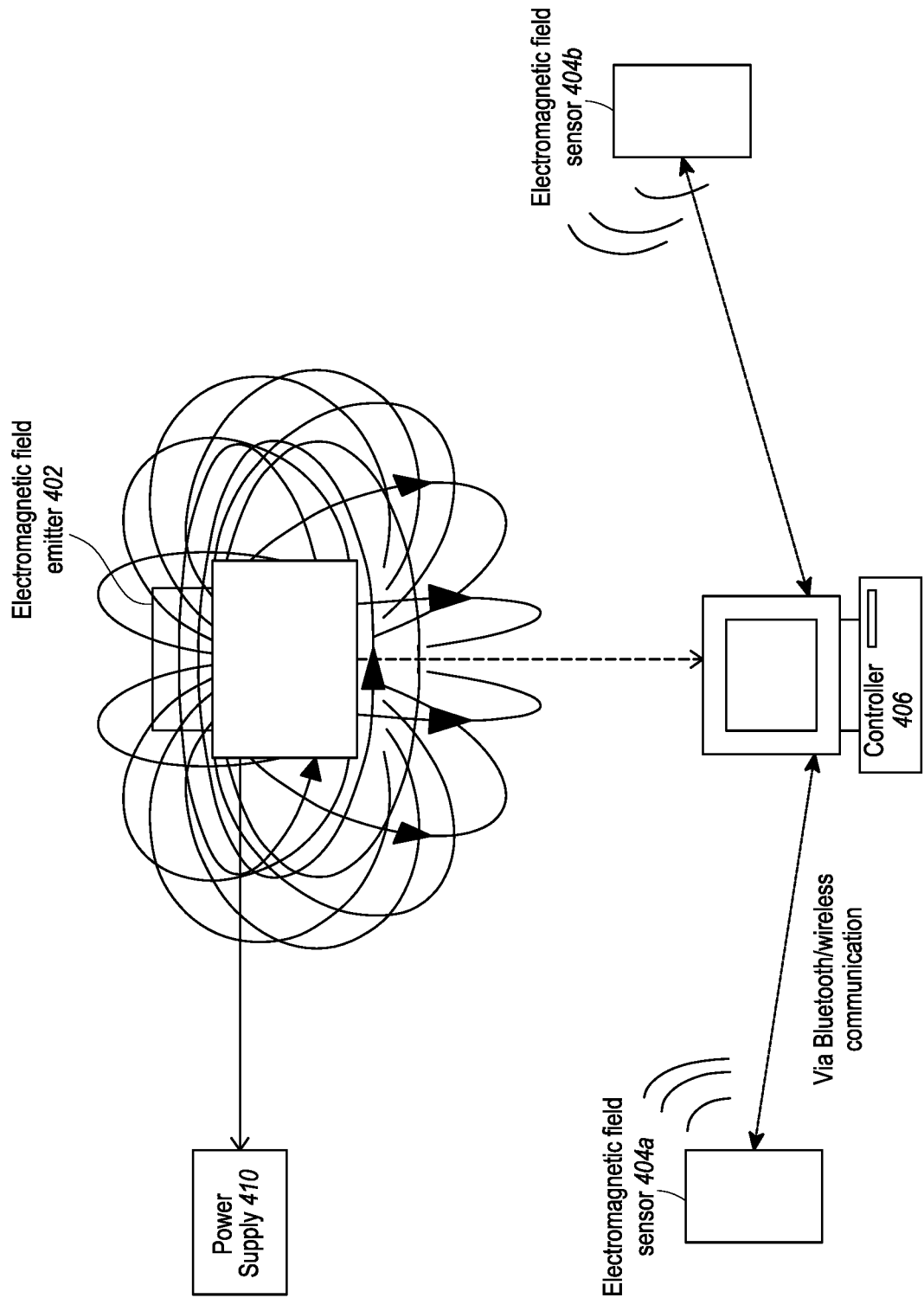
FIG. 4 schematically illustrates an example system diagram of an electromagnetic (EM) tracking system.

Referring now to FIG. 4, an example system diagram of an electromagnetic tracking system (e.g., such as those developed by organizations such as the Biosense division of Johnson & Johnson Corporation, Polhemus, Inc. of Colchester, Vt., manufactured by Sixense Entertainment, Inc. of Los Gatos, Calif., and other tracking companies) is illustrated. In one or more embodiments, the electromagnetic tracking system comprises an electromagnetic field emitter 402 which is configured to emit a known magnetic field. As shown in FIG. 4, the electromagnetic field emitter may be coupled to a power supply (e.g., electric current, batteries, etc.) to provide power to the emitter 402.

In one or more embodiments, the electromagnetic field emitter 402 comprises several coils (e.g., at least three coils positioned perpendicular to each other to produce field in the X, Y and Z directions) that generate magnetic fields. This magnetic field is used to establish a coordinate space (e.g., an X-Y-Z Cartesian coordinate space). This allows the system to map a position of the sensors (e.g., an (X,Y,Z) position) in relation to the known magnetic field, and helps determine a position and/or orientation of the sensors. In one or more embodiments, the electromagnetic (EM) sensors 404a, 404b, etc. may be attached to one or more real objects. The electromagnetic sensors 404 may comprise smaller coils in which current may be induced through the emitted electromagnetic field. Generally the "sensor" components (404) may comprise small coils or loops, such as a set of three differently-oriented (e.g., such as orthogonally oriented relative to each other) coils coupled together within a small structure such as a cube or other container, that are positioned/oriented to capture incoming magnetic flux from the magnetic field emitted by the emitter (402), and by comparing currents induced through these coils, and knowing the relative positioning and orientation of the coils relative to each other, relative position and orientation of a sensor relative to the emitter may be calculated.

Figure 6:
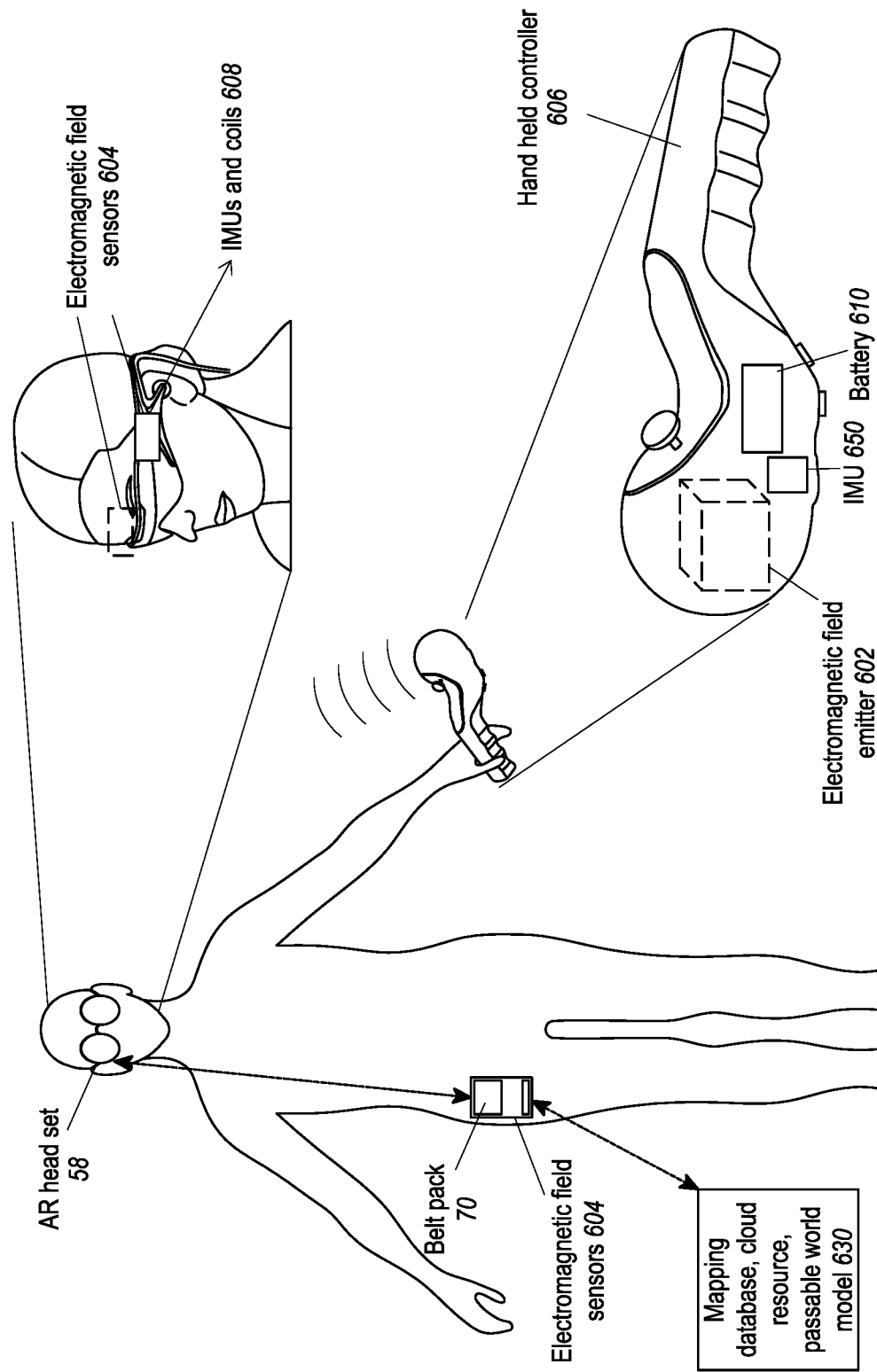
FIG. 6 schematically illustrates an example of an electromagnetic tracking system incorporated with an AR system.

One or more parameters pertaining to a behavior of the coils and inertial measurement unit ("IMU") components operatively coupled to the electromagnetic tracking sensors may be measured to detect a position and/or orientation of the sensor (and the object to which it is attached to) relative to a coordinate system to which the electromagnetic field emitter is coupled. In one or more embodiments, multiple sensors may be used in relation to the electromagnetic emitter to detect a position and orientation of each of the sensors within the coordinate space. The electromagnetic tracking system may provide positions in three directions (e.g., X, Y and Z directions), and further in two or three orientation angles (e.g., yaw, pitch, and roll). For example, the EM tracking system may determine a six degree-of-freedom (6DOF) pose comprising three spatial coordinates (e.g., X, Y, and Z) and three orientation angles (e.g., yaw, pitch, and roll). In one or more embodiments, measurements of the IMU may be compared to the measurements of the coil to determine a position and orientation of the sensors. In one or more embodiments, both electromagnetic (EM) data and IMU data, along with various other sources of data, such as cameras, depth sensors, and other sensors, may be combined to determine the position and orientation. This information may be transmitted (e.g., wireless communication, Bluetooth, etc.) to the controller 406. In one or more embodiments, pose (or position and orientation) may be reported at a relatively high refresh rate in conventional systems. Conventionally an electromagnetic field emitter is coupled to a relatively stable and large object, such as a table, operating table, wall, or ceiling, and one or more sensors are coupled to smaller objects, such as medical devices, handheld gaming components, or the like. Alternatively, as described below in reference to FIG. 6, various features of the electromagnetic tracking system may be employed to produce a configuration wherein changes or deltas in position and/or orientation between two objects that move in space relative to a more stable global coordinate system may be tracked; in other words, a configuration is shown in FIG. 6 wherein a variation of an electromagnetic tracking system may be utilized to track position and orientation delta between a head-mounted component and a hand-held component, while head pose relative to the global coordinate system (say of the room environment local to the user) is determined otherwise, such as by simultaneous localization and mapping ("SLAM") techniques using outward-capturing cameras which may be coupled to the head mounted component of the system.

The controller 406 may control the electromagnetic field generator 402, and may also capture data from the various electromagnetic sensors 404. It should be appreciated that the various components of the system may be coupled to each other through any electro-mechanical or wireless/Bluetooth means. The controller 406 may also comprise data regarding the known magnetic field, and the coordinate space in relation to the magnetic field. This information is then used to detect the position and orientation of the sensors in relation to the coordinate space corresponding to the known electromagnetic field.

One advantage of electromagnetic tracking systems is that they produce highly accurate tracking results with minimal latency and high resolution. Additionally, the electromagnetic tracking system does not necessarily rely on optical trackers, and sensors/objects not in the user's line-of-vision may be easily tracked.

It should be appreciated that the strength of the electromagnetic field drops as a cubic function of distance r from a coil transmitter (e.g., electromagnetic field emitter 402). Thus, an algorithm may be used based on a distance away from the electromagnetic field emitter. The controller 406 may be configured with such algorithms to determine a position and orientation (e.g., a 6DOF pose) of the sensor/object at varying distances away from the electromagnetic field emitter. Given the rapid decline of the strength of the electromagnetic field as the sensor moves farther away from the electromagnetic emitter, best results, in terms of accuracy, efficiency and low latency, may be achieved at closer distances. In typical electromagnetic tracking systems, the electromagnetic field emitter is powered by electric current (e.g., plug-in power supply) and has sensors located within 20 ft radius away from the electromagnetic field emitter. A shorter radius between the sensors and field emitter may be more desirable in many applications, including AR applications.

Figure 5:
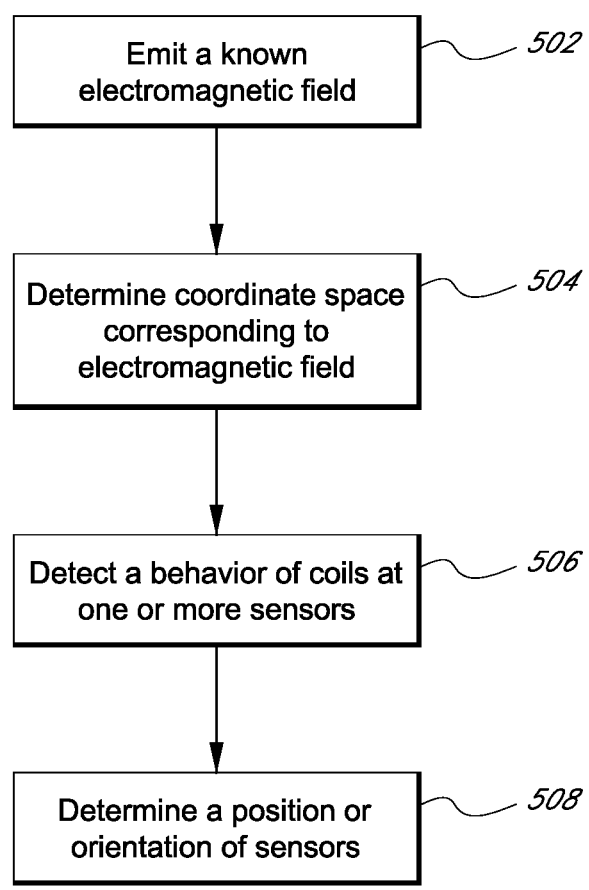
FIG. 5 is a flowchart describing example functioning of an embodiment of an electromagnetic tracking system.

Referring now to FIG. 5, an example flowchart describing a functioning of a typical electromagnetic tracking system is briefly described. At 502, a known electromagnetic field is emitted. In one or more embodiments, the magnetic field emitter may generate magnetic fields each coil may generate an electric field in one direction (e.g., X, Y or Z). The magnetic fields may be generated with an arbitrary waveform. In one or more embodiments, the magnetic field component along each of the axes may oscillate at a slightly different frequency from other magnetic field components along other directions. At 504, a coordinate space corresponding to the electromagnetic field may be determined. For example, the control 406 of FIG. 4 may automatically determine a coordinate space around the emitter based on the electromagnetic field. At 506, a behavior of the coils at the sensors (which may be attached to a known object) may be detected. For example, a current induced at the coils may be calculated. In other embodiments, a rotation of coils, or any other quantifiable behavior may be tracked and measured. At 508, this behavior may be used to detect a position or orientation of the sensor(s) and/or known object. For example, the controller 406 may consult a mapping table that correlates a behavior of the coils at the sensors to various positions or orientations. Based on these calculations, the position in the coordinate space along with the orientation of the sensors may be determined.

In the context of AR systems, one or more components of the electromagnetic tracking system may need to be modified to facilitate accurate tracking of mobile components. As described above, tracking the user's head pose and orientation may be desirable in many AR applications. Accurate determination of the user's head pose and orientation allows the AR system to display the right virtual content to the user. For example, the virtual scene may comprise a monster hiding behind a real building. Depending on the pose and orientation of the user's head in relation to the building, the view of the virtual monster may need to be modified such that a realistic AR experience is provided. Or, a position and/or orientation of a totem, haptic device or some other means of interacting with a virtual content may be important in enabling the AR user to interact with the AR system. For example, in many gaming applications, the AR system can detect a position and orientation of a real object in relation to virtual content. Or, when displaying a virtual interface, a position of a totem, user's hand, haptic device or any other real object configured for interaction with the AR system can be known in relation to the displayed virtual interface in order for the system to understand a command, etc. Conventional localization methods including optical tracking and other methods are typically plagued with high latency and low resolution problems, which makes rendering virtual content challenging in many augmented reality applications.

In one or more embodiments, the electromagnetic tracking system, discussed in relation to FIGS. 4 and 5 may be adapted to the AR system to detect position and orientation of one or more objects in relation to an emitted electromagnetic field. Typical electromagnetic systems tend to have a large and bulky electromagnetic emitters (e.g., 402 in FIG. 4), which is problematic for head-mounted AR devices. However, smaller electromagnetic emitters (e.g., in the millimeter range) may be used to emit a known electromagnetic field in the context of the AR system.

Referring now to FIG. 6, an electromagnetic tracking system may be incorporated with an AR system as shown, with an electromagnetic field emitter 602 incorporated as part of a hand-held controller 606. The controller 606 can be movable independently relative to the AR headset (or the belt pack 70). For example, the user can hold the controller 606 in his or her hand, or the controller could be mounted to the user's hand or arm (e.g., as a ring or bracelet or as part of a glove worn by the user). In one or more embodiments, the hand-held controller may be a totem to be used in a gaming scenario (e.g., a multi-degree-of-freedom controller) or to provide a rich user experience in an AR environment or to allow user interaction with an AR system. In other embodiments, the hand-held controller may be a haptic device. In yet other embodiments, the electromagnetic field emitter may simply be incorporated as part of the belt pack 70. The hand-held controller 606 may comprise a battery 610 or other power supply that powers that electromagnetic field emitter 602. It should be appreciated that the electromagnetic field emitter 602 may also comprise or be coupled to an IMU 650 component configured to assist in determining positioning and/or orientation of the electromagnetic field emitter 602 relative to other components. This may be especially advantageous in cases where both the field emitter 602 and the sensors (604) are mobile. Placing the electromagnetic field emitter 602 in the hand-held controller rather than the belt pack, as shown in the embodiment of FIG. 6, helps ensure that the electromagnetic field emitter is not competing for resources at the belt pack, but rather uses its own battery source at the hand-held controller 606. In yet other embodiments, the electromagnetic field emitter 602 can be disposed on the AR headset and the sensors 604 can be disposed on the controller 606 or belt pack 70.

In one or more embodiments, the electromagnetic sensors 604 may be placed on one or more locations on the user's headset, along with other sensing devices such as one or more IMUs or additional magnetic flux capturing coils 608. For example, as shown in FIG. 6, sensors (604, 608) may be placed on one or both sides of the head set (58). Since these sensors are engineered to be rather small (and hence may be less sensitive, in some cases), having multiple sensors may improve efficiency and precision. In one or more embodiments, one or more sensors may also be placed on the belt pack 70 or any other part of the user's body. The sensors (604, 608) may communicate wirelessly or through Bluetooth to a computing apparatus that determines a pose and orientation of the sensors (and the AR headset to which it is attached). In one or more embodiments, the computing apparatus may reside at the belt pack 70. In other embodiments, the computing apparatus may reside at the headset itself, or even the hand-held controller 606. The computing apparatus may in turn comprise a mapping database (e.g., passable world model, coordinate space, etc.) to detect pose, to determine the coordinates of real objects and virtual objects, and may even connect to cloud resources and the passable world model, in one or more embodiments.

As described above, conventional electromagnetic emitters may be too bulky for AR devices. Therefore the electromagnetic field emitter may be engineered to be compact, using smaller coils compared to traditional systems. However, given that the strength of the electromagnetic field decreases as a cubic function of the distance away from the field emitter, a shorter radius between the electromagnetic sensors 604 and the electromagnetic field emitter 602 (e.g., about 3 to 3.5 ft) may reduce power consumption when compared to conventional systems such as the one detailed in FIG. 4.

This aspect may either be utilized to prolong the life of the battery 610 that may power the controller 606 and the electromagnetic field emitter 602, in one or more embodiments. Or, in other embodiments, this aspect may be utilized to reduce the size of the coils generating the magnetic field at the electromagnetic field emitter 602. However, in order to get the same strength of magnetic field, the power may be need to be increased. This allows for a compact electromagnetic field emitter unit 602 that may fit compactly at the hand-held controller 606.

Several other changes may be made when using the electromagnetic tracking system for AR devices. Although this pose reporting rate is rather good, AR systems may require an even more efficient pose reporting rate. To this end, IMU-based pose tracking may (additionally or alternatively) be used in the sensors. Advantageously, the IMUs may remain as stable as possible in order to increase an efficiency of the pose detection process. The IMUs may be engineered such that they remain stable up to 50-100 milliseconds. It should be appreciated that some embodiments may utilize an outside pose estimator module (e.g., IMUs may drift over time) that may enable pose updates to be reported at a rate of 10 to 20 Hz. By keeping the IMUs stable at a reasonable rate, the rate of pose updates may be dramatically decreased to 10 to 20 Hz (as compared to higher frequencies in conventional systems).

If the electromagnetic tracking system can be run at, for example, a 10% duty cycle (e.g., only pinging for ground truth every 100 milliseconds), this would be another way to save power at the AR system. This would mean that the electromagnetic tracking system wakes up every 10 milliseconds out of every 100 milliseconds to generate a pose estimate. This directly translates to power consumption savings, which may, in turn, affect size, battery life and cost of the AR device.

In one or more embodiments, this reduction in duty cycle may be strategically utilized by providing two hand-held controllers (not shown) rather than just one. For example, the user may be playing a game that requires two totems, etc. Or, in a multi-user game, two users may have their own totems/hand-held controllers to play the game. When two controllers (e.g., symmetrical controllers for each hand) are used rather than one, the controllers may operate at offset duty cycles. The same concept may also be applied to controllers utilized by two different users playing a multi-player game, for example.

Figure 7:
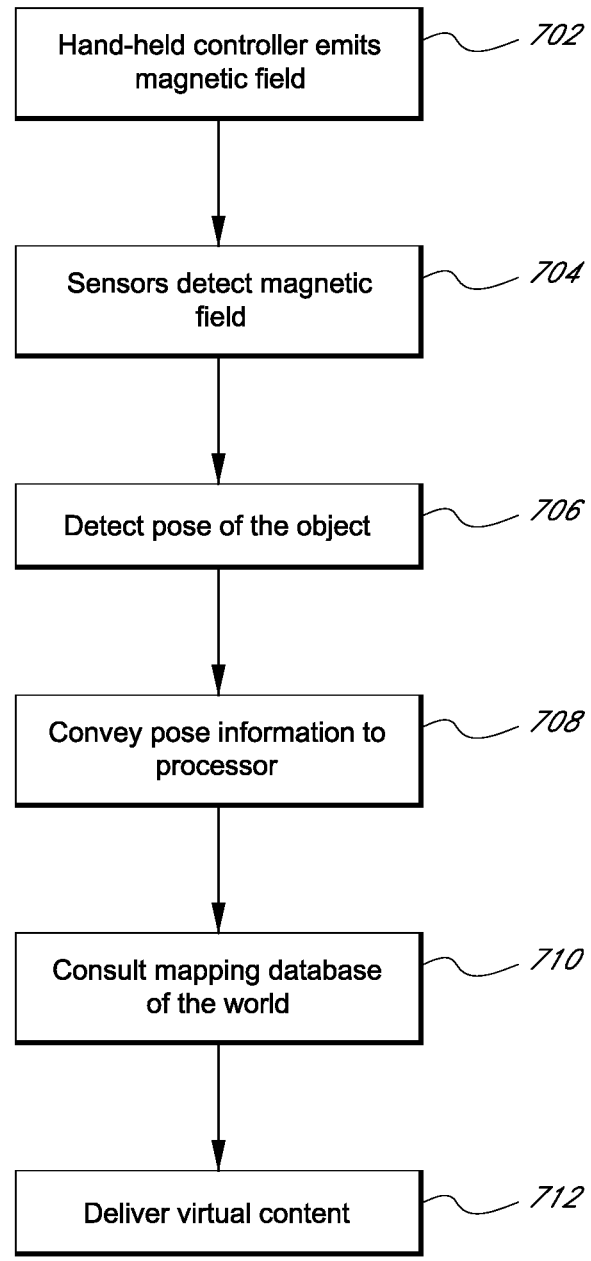
FIG. 7 is a flowchart describing functioning of an example of an electromagnetic tracking system in the context of an AR device.

Referring now to FIG. 7, an example flow chart describing the electromagnetic tracking system in the context of AR devices is described. At 702, a portable (e.g., hand-held) controller emits a magnetic field. At 704, the electromagnetic sensors (placed on headset, belt pack, etc.) detect the magnetic field. At 706, a pose (e.g., position or orientation) of the headset/belt is determined based on a behavior of the coils/IMUs at the sensors. The pose may comprise a 6DOF pose or have fewer than all six degrees of freedom (e.g., one or more spatial coordinates or one or more orientation angles). At 708, the pose information is conveyed to the computing apparatus (e.g., at the belt pack or headset). At 710, optionally, a mapping database (e.g., passable world model) may be consulted to correlate the real world coordinates (e.g., determined for the pose of the headset/belt) with the virtual world coordinates. At 712, virtual content may be delivered to the user at the AR headset and displayed to the user (e.g., via the light field displays described herein). It should be appreciated that the flowchart described above is for illustrative purposes only, and should not be read as limiting.

Advantageously, using an electromagnetic tracking system similar to the one outlined in FIG. 6 enables pose tracking (e.g., head position and orientation, position and orientation of totems, belt packs, and other controllers). This allows the AR system to project virtual content (based at least in part on the determined pose) with a higher degree of accuracy, and very low latency when compared to optical tracking techniques.

Figure 8:
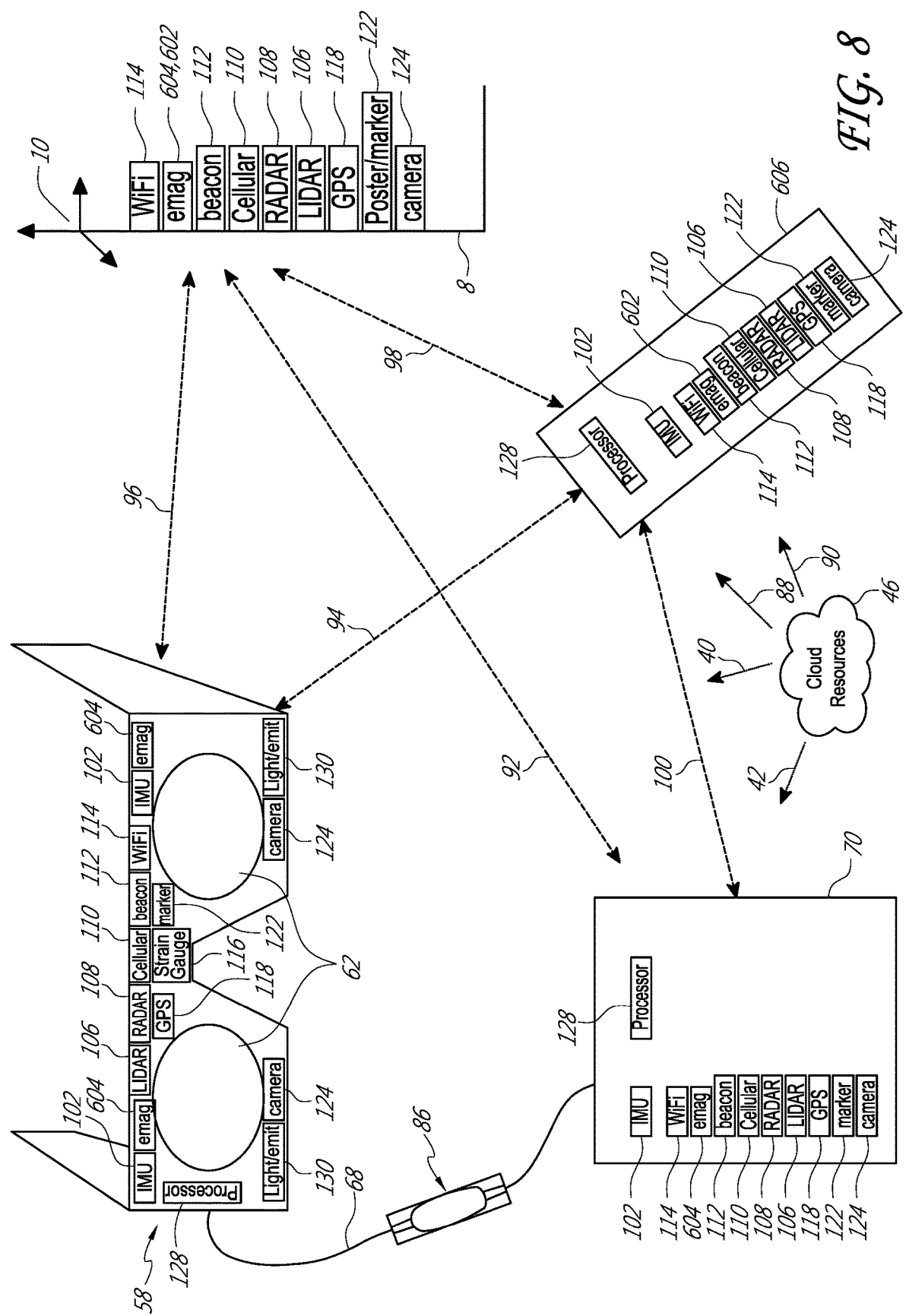
FIG. 8 schematically illustrates examples of components of an embodiment of an AR system.

Referring to FIG. 8, a system configuration is illustrated wherein featuring many sensing components. A head mounted wearable component (58) is shown operatively coupled (68) to a local processing and data module (70), such as a belt pack, here using a physical multicore lead which also features a control and quick release module (86). The control and quick release module (86) can include buttons for operation of the associated system, for example, an on/off button and up/down volume controls. Opposing ends of the module (86) can be connected to electrical leads running between the local processing and data module (70) and the display (62) as shown in FIG. 8.

The local processing and data module (70) is operatively coupled (100) to a hand held component (606), here by a wireless connection such as low power Bluetooth; the hand held component (606) may also be operatively coupled (94) directly to the head mounted wearable component (58), such as by a wireless connection such as low power Bluetooth. Generally where IMU data is passed to coordinate pose detection of various components, a high-frequency connection is desirable, such as in the range of hundreds or thousands of cycles/second or higher; tens of cycles per second may be adequate for electromagnetic localization sensing, such as by the sensor (604) and transmitter (602) pairings. Also shown is a global coordinate system (10), representative of fixed objects in the real world around the user, such as a wall (8).

Cloud resources (46) also may be operatively coupled (42, 40, 88, 90) to the local processing and data module (70), to the head mounted wearable component (58), to resources which may be coupled to the wall (8) or other item fixed relative to the global coordinate system (10), respectively. The resources coupled to the wall (8) or having known positions and/or orientations relative to the global coordinate system (10) may include a wireless transceiver (114), an electromagnetic emitter (602) and/or receiver (604), a beacon or reflector (112) configured to emit or reflect a given type of radiation, such as an infrared LED beacon, a cellular network transceiver (110), a RADAR emitter or detector (108), a LIDAR emitter or detector (106), a GPS transceiver (118), a poster or marker having a known detectable pattern (122), and a camera (124).

The head mounted wearable component (58) features similar components, as illustrated, in addition to lighting emitters (130) configured to assist the camera (124) detectors, such as infrared emitters (130) for an infrared camera (124); also featured on the head mounted wearable component (58) are one or more strain gauges (116), which may be fixedly coupled to the frame or mechanical platform of the head mounted wearable component (58) and configured to determine deflection of such platform in between components such as electromagnetic receiver sensors (604) or display elements (62), wherein it may be valuable to understand if bending of the platform has occurred, such as at a thinned portion of the platform, such as the portion above the nose on the eyeglasses-like platform depicted in FIG. 8.

The head mounted wearable component (58) also features a processor (128) and one or more IMUs (102). Each of the components preferably are operatively coupled to the processor (128). The hand held component (606) and local processing and data module (70) are illustrated featuring similar components. As shown in FIG. 8, with so many sensing and connectivity means, such a system is likely to be heavy, power hungry, large, and relatively expensive. However, for illustrative purposes, such a system may be utilized to provide a very high level of connectivity, system component integration, and position/orientation tracking. For example, with such a configuration, the various main mobile components (58, 70, 606) may be localized in terms of position relative to the global coordinate system using WiFi, GPS, or Cellular signal triangulation; beacons, electromagnetic tracking (as described herein), RADAR, and LIDAR systems may provide yet further location and/or orientation information and feedback. Markers and cameras also may be utilized to provide further information regarding relative and absolute position and orientation. For example, the various camera components (124), such as those shown coupled to the head mounted wearable component (58), may be utilized to capture data which may be utilized in simultaneous localization and mapping protocols, or "SLAM", to determine where the component (58) is and how it is oriented relative to other components.

In some embodiments, in addition or as an alternative to a LIDAR (106) type of depth sensor, the system includes a generic depth camera or depth sensor, which may, for example, be either a stereo triangulation style depth sensor (such as a passive stereo depth sensor, a texture projection stereo depth sensor, or a structured light stereo depth sensor) or a time or flight style depth sensor (such as a LIDAR depth sensor or a modulated emission depth sensor); further, the system may include an additional forward facing "world" camera (124, which may be a grayscale camera, having a sensor capable of 720p range resolution) as well as a relatively high-resolution "picture camera" (which may be a full color camera, having a sensor capable of two megapixel or higher resolution, for example).

Example Electromagnetic Sensing Components in an AR System

Figure 9A:
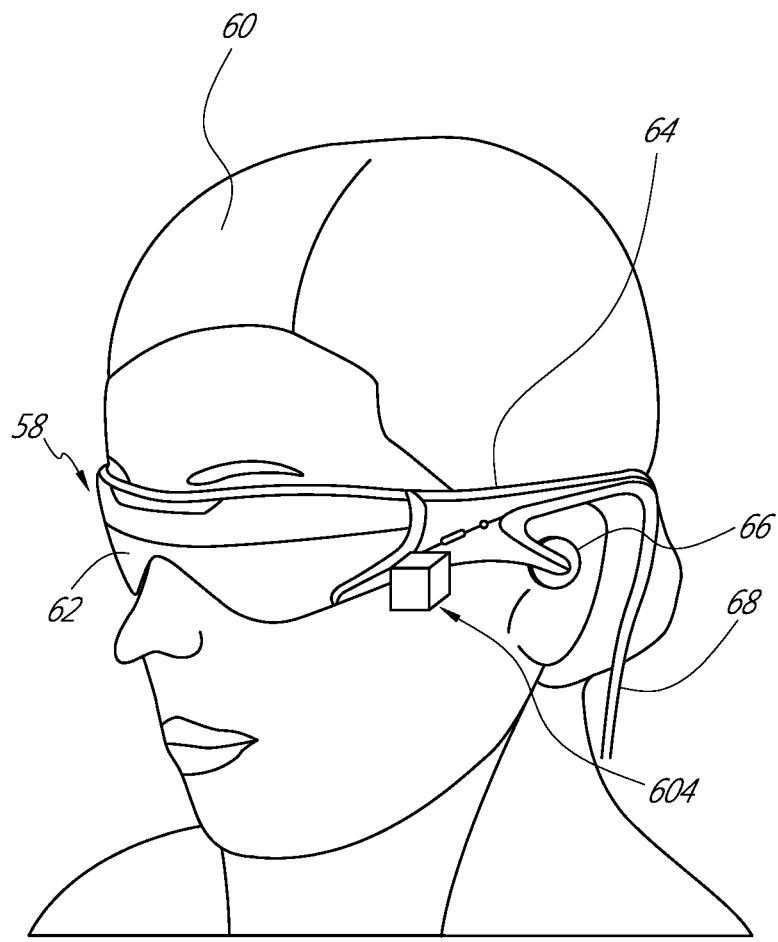
FIGS. 9A and 9B schematically illustrate examples of electromagnetic sensing coils coupled to a head-mounted display.
Figure 9B:
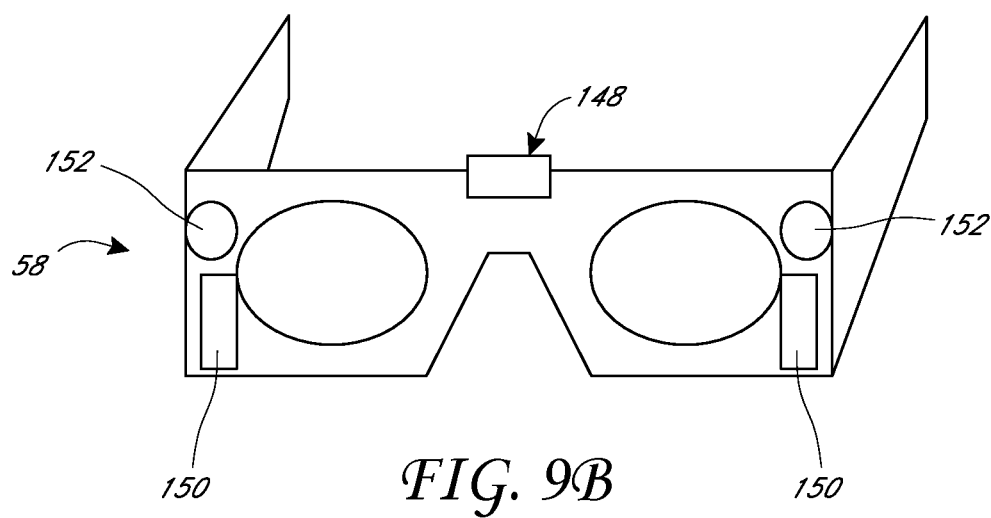

Referring to FIG. 9A, an electromagnetic sensing coil assembly (604, e.g., 3 individual coils coupled to a housing) is shown coupled to a head mounted component (58); such a configuration adds additional geometry to the overall assembly which may not be desirable. Referring to FIG. 9B, rather than housing the coils in a box or single housing 604 as in the configuration of FIG. 9A, the individual coils may be integrated into the various structures of the head mounted component (58), as shown in FIG. 9B. FIG. 9B shows examples of locations on the head-mounted display 58 for X-axis coils (148), Y-axis coils (150), and Z-axis coils (152). Thus, the sensing coils can be distributed spatially on or about the head-mounted display (58) to provide a desired spatial resolution or accuracy of the localization and/or orientation of the display (58) by the electromagnetic tracking system.

Referring again to FIG. 9B, a distributed sensor coil configuration is shown for the AR device 58. The AR device 58 can have a single electromagnetic sensor device (604), such as a housing containing three orthogonal sensing coils, one for each direction of X, Y, Z, which may be coupled to the wearable component (58) for 6 degree of freedom (6DOF) tracking, as described herein. Also as noted above, such a device may be dis-integrated, with the three sub-portions (e.g., coils) attached at different locations of the wearable component (58), as shown in FIG. 9B. To provide further design alternatives, each individual sensor coil may be replaced with a group of similarly oriented coils, such that the overall magnetic flux for any given orthogonal direction is captured by the group rather than by a single coil for each orthogonal direction. In other words, rather than one coil for each orthogonal direction, a group of smaller coils may be utilized and their signals aggregated to form the signal for that orthogonal direction. In another embodiment wherein a particular system component, such as a head mounted component (58) features two or more electromagnetic coil sensor sets, the system may be configured to selectively utilize the sensor and emitter pairing that are closest to each other (e.g., within 1 cm, 2 cm, 3 cm, 4 cm, 5 cm, or 10 cm) to improve or optimize the performance of the system.

Electromagnetic ("EM") tracking updating can be relatively "expensive" in terms of power for a portable system, and may not be capable of very high frequency updating. In a "sensor fusion" configuration, more frequently updated localization information from another sensor such as an IMU may be combined, along with data from another sensor, such as an optical sensor (e.g., a camera or a depth camera), which may or may not be at a relatively high frequency; the net of fusing all of these inputs places a lower demand upon the EM system and provides for quicker updating.

Examples of EM Tracking of User Head Pose or Hand Pose

Figure 10:
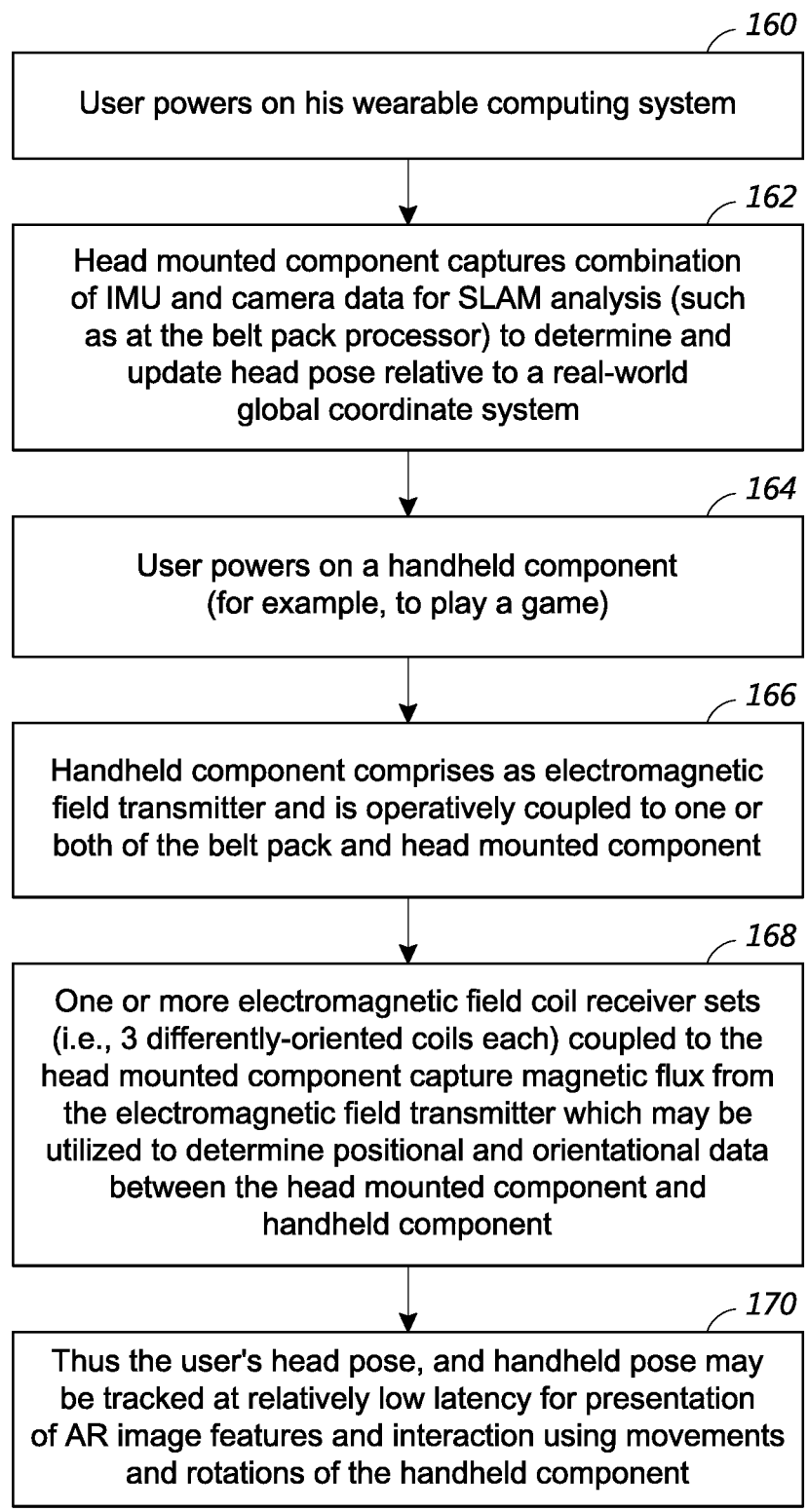
FIGS. 10 and 11 are flowcharts that illustrate examples of pose tracking with an electromagnetic tracking system in a head-mounted AR system.

Referring to FIG. 10, in one embodiment, after a user powers up his or her wearable computing system (160), a head mounted component assembly may capture a combination of IMU and camera data (the camera data being used, for example, for SLAM analysis, such as at the belt pack processor where there may be more raw processing horsepower present) to determine and update head pose (e.g., position or orientation) relative to a real world global coordinate system (162). The user may also activate a handheld component to, for example, play an augmented reality game (164), and the handheld component may comprise an electromagnetic transmitter operatively coupled to one or both of the belt pack and head mounted component (166). One or more electromagnetic field coil receiver sets (e.g., a set being 3 differently-oriented individual coils) coupled to the head mounted component to capture magnetic flux from the transmitter, which may be utilized to determine positional or orientational difference (or "delta"), between the head mounted component and handheld component (168). The combination of the head mounted component assisting in determining pose relative to the global coordinate system, and the hand held assisting in determining relative location and orientation of the handheld relative to the head mounted component, allows the system to generally determine where each component is relative to the global coordinate system, and thus the user's head pose, and handheld pose may be tracked, preferably at relatively low latency, for presentation of augmented reality image features and interaction using movements and rotations of the handheld component (170).

Figure 11:
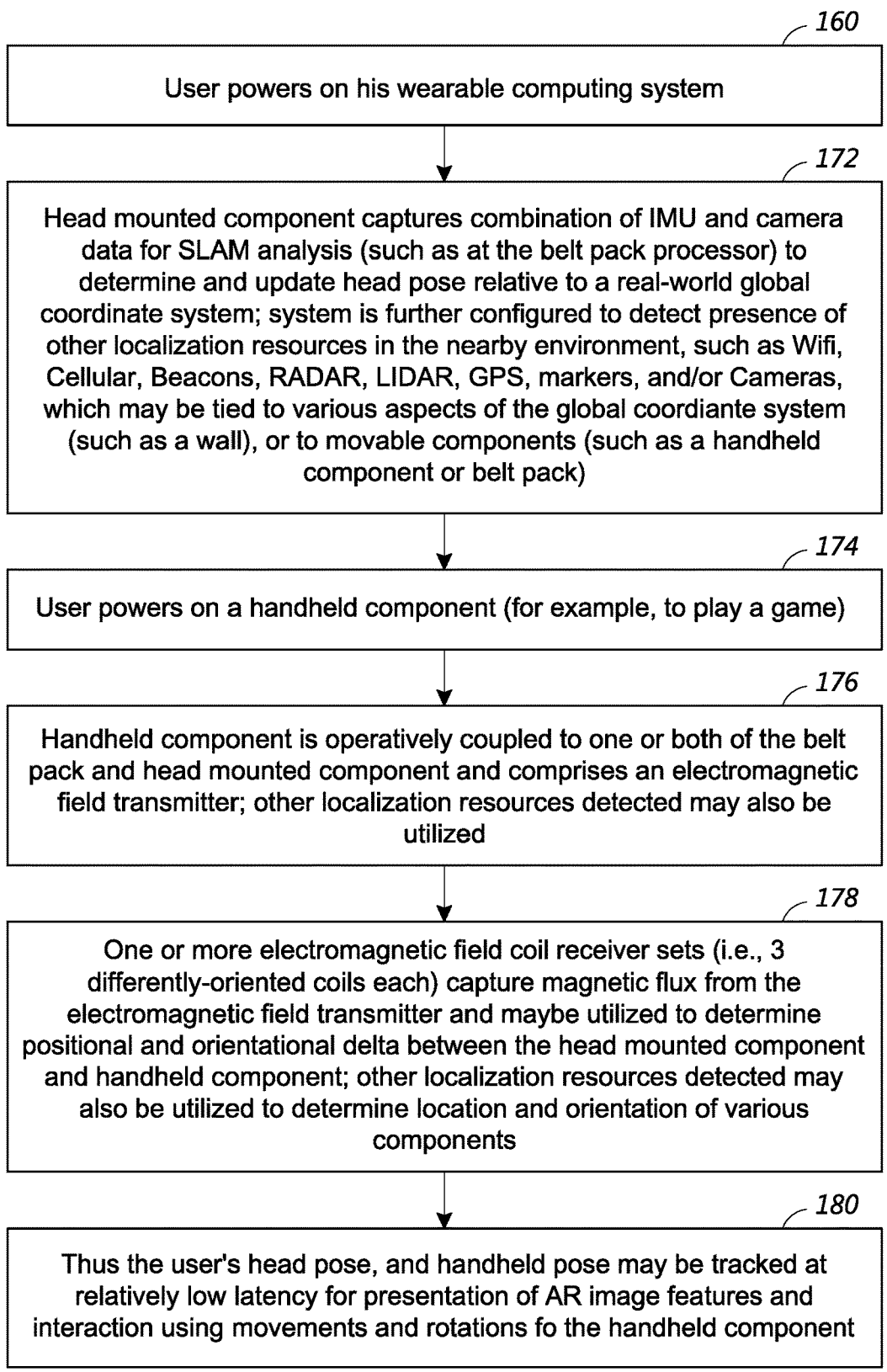

Referring to FIG. 11, an embodiment is illustrated that is somewhat similar to that of FIG. 10, with the exception that the system has many more sensing devices and configurations available to assist in determining pose of both the head mounted component (172) and a hand held component (176, 178), such that the user's head pose, and handheld pose may be tracked, preferably at relatively low latency, for presentation of augmented reality image features and interaction using movements and rotations of the handheld component (180).

In various implementations, the augmented reality device can include a computer vision system configured to implement one or more computer vision techniques to identify objects in the environment of the system, user gestures, or perform other computer vision procedures used or described herein. Non-limiting examples of computer vision techniques include: Scale-invariant feature transform (SIFT), speeded up robust features (SURF), oriented FAST and rotated BRIEF (ORB), binary robust invariant scalable keypoints (BRISK), fast retina keypoint (FREAK), Viola-Jones algorithm, Eigenfaces approach, Lucas-Kanade algorithm, Horn-Schunk algorithm, Mean-shift algorithm, visual simultaneous location and mapping (vSLAM) techniques, a sequential Bayesian estimator (e.g., Kalman filter, extended Kalman filter, etc.), bundle adjustment, Adaptive thresholding (and other thresholding techniques), Iterative Closest Point (ICP), Semi Global Matching (SGM), Semi Global Block Matching (SGBM), Feature Point Histograms, various machine learning algorithms (such as e.g., support vector machine, k-nearest neighbors algorithm, Naive Bayes, neural network (including convolutional or deep neural networks), or other supervised/unsupervised models, etc.), and so forth.

Overview of Sensor Fusion and Sensor Estimation

Figure 12:
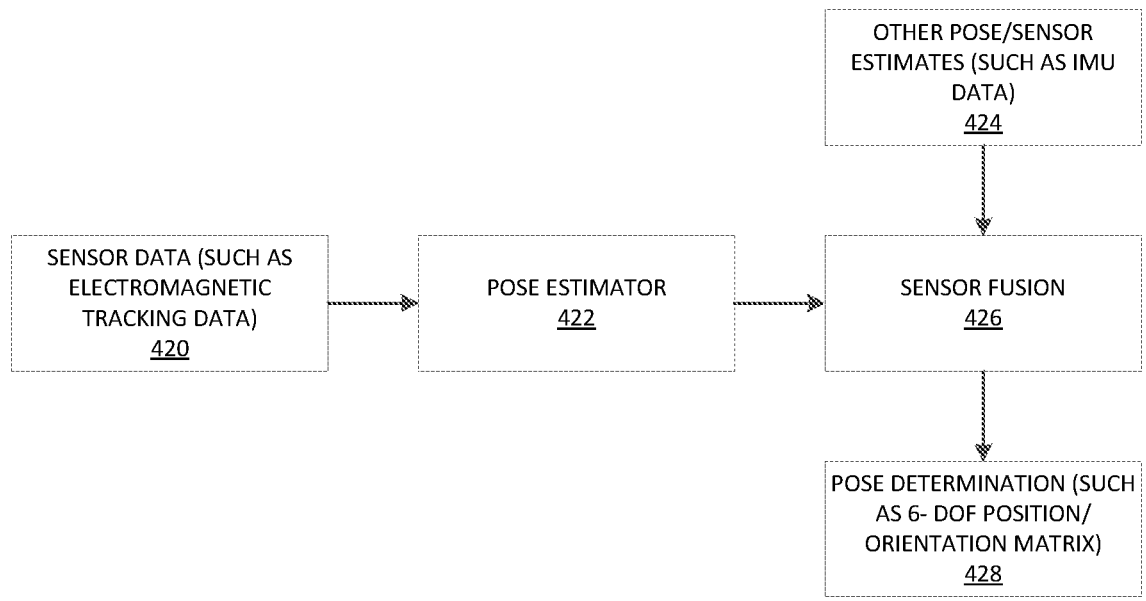
FIG. 12 is a process flow diagram that illustrates an embodiment of sensor fusion in which sensor data passes through a pose estimator before passing to a sensor fusion block.

FIG. 12 is a process flow diagram that illustrates an example embodiment of sensor fusion of estimated data with "lossy" data from a sensor and processed by a pose estimator for use in, for example, an electromagnetic tracking system (e.g., used with the head-mounted AR system 58). Referring to FIG. 12, within a sensor fusion paradigm, two paths of blocks result in fusing, comparing, or combining data for use in determining one or parameters of a pose. Other details of a sensor fusion paradigm are included in U.S. patent application Ser. No. 15/898,212, filed Feb. 15, 2018, titled Systems and Methods for Augmented Reality, which is hereby incorporated by reference herein in its entirety.

In a first of the two paths, sensor data (420), which can include EM tracking data) is sent through a pose estimator module (422), which may result in "lossy" data. In some embodiments, the sensor data (420) may include interference or other sources of inaccurate data which may cause the data to be lossy or include errors or inaccuracies. In some embodiments, the pose estimator module (422) may introduce inaccurate data or otherwise make the pose output by the pose estimator module (422) lossy.

The second path includes information from the other pose/sensor estimation block (424) and may include data from other sensors such as an IMU or any of the other sensors described with reference to FIG. 8. A sensor fusion block (426) combines the output of the pose estimator (422) of the first path, including the lossy data, with the estimated data or information from the second path, block 424. The lossy data from the first path may introduce certain losses in accuracy for the overall pose determination output (428).

For example, the sensor data (for example, electromagnetic (EM) tracking data from EM sensors described with reference to FIGS. 4 to 7) may be obtained (for example, received from the EM sensors) at step 420. In some embodiments, the sensor data (420) may include noise, interference, or other inaccuracies. The sensor data may be passed to the pose estimator at block 422, which may estimate a pose based on the sensor data from block 420. Such a pose estimator step (422) may be considered to be a "lossy step" in terms of accuracy and precision because the pose estimator block 422 may introduce error into the sensor data or otherwise reduce accuracy or precision of the sensor data. Based on this "lossy step" 422, the overall pose determination configuration (428) may be deemed a "loose integration" configuration.

Figure 13:
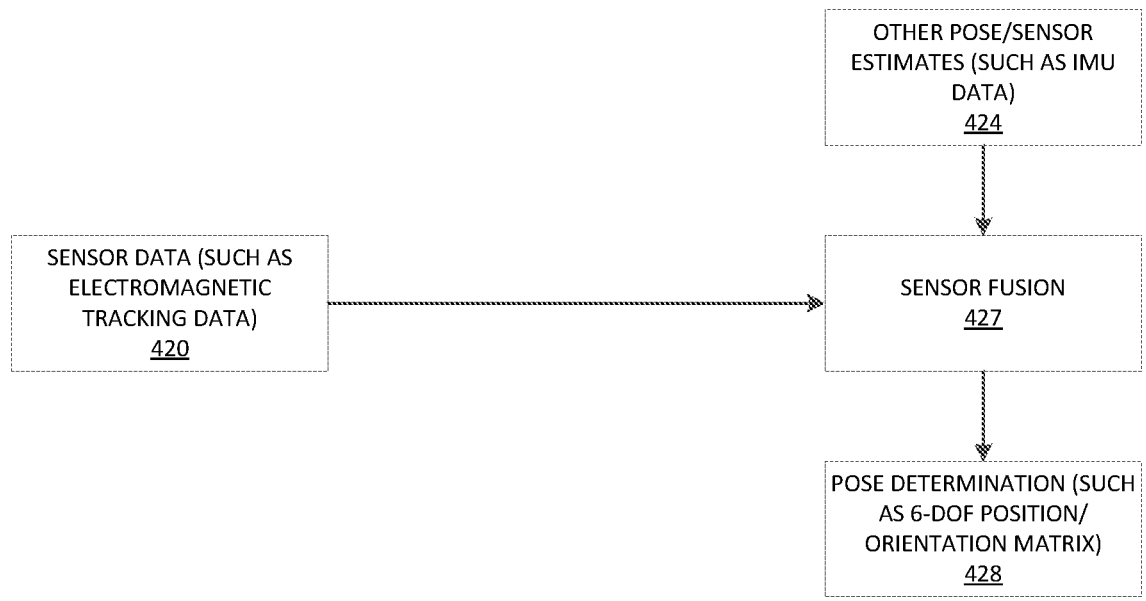
FIG. 13 is a process flow diagram that illustrates an embodiment of sensor fusion in which sensor data passes to a sensor fusion block, without se of the pose estimator of FIG. 12.

FIG. 13 is a process flow diagram that illustrates an embodiment of sensor fusion without the "lossy step" from the pose estimator. The sensor fusion described with reference to FIG. 13 is referred to as a "tight integration" or "tightly coupled" sensor fusion configuration, where the aforementioned "lossy step" (422) of the configuration of FIG. 12 is removed. Accordingly, the sensor fusion block (427) receives the raw sensor data (420) from the first path directly, wherein at least one component of the sensor fusion block (427) may interpret the received raw sensor data (420). Tightly coupled sensor fusion configurations have been implemented and utilized, for example, in global positioning satellite (GPS) and inertial navigation system (INS) tracking configurations, wherein the GPS signals may be utilized in a sensor fusion with INS signals from, for example, an inertial measurement unit (IMU) which may include accelerometers, gyroscopes, or magnetometers.

In some implementations, the INS or IMU accelerometers may produce an unknown bias signal that becomes a positional error, for example when integrated twice. Gyroscope components of the INS or IMU devices may also produce unknown biases which may affect position and/or orientation outputs of the INS or IMU devices.

GPS data may provide a relatively drift-free position value which may be used to re-set the INS or IMU device or which may be blended, fused, or used in conjunction with the INS or IMU device using one or more mathematical algorithms, for example, a Kalman filter. With such a blended or fusion configuration, the INS or IMU device may be calibrated by the GPS signals, and the calibrated INS or IMU device can provide position and angle updates at a higher update frequency than the GPS may produce. Thus, GPS and INS systems may be complementarily employed together, such as in aircraft, spacecraft, or missile navigation systems.

Example Reverse Sensor Data Generator

With regard to the "lossy step", or the pose estimator step (422) described herein, various embodiments may overcome or cure the lossy nature of the pose estimator step (422) in the tight integration configuration with the use of, for example, a reverse optimization approach described below. Example embodiments utilizing such reverse optimization are described herein in reference to FIGS. 14-18.

Figure 14:
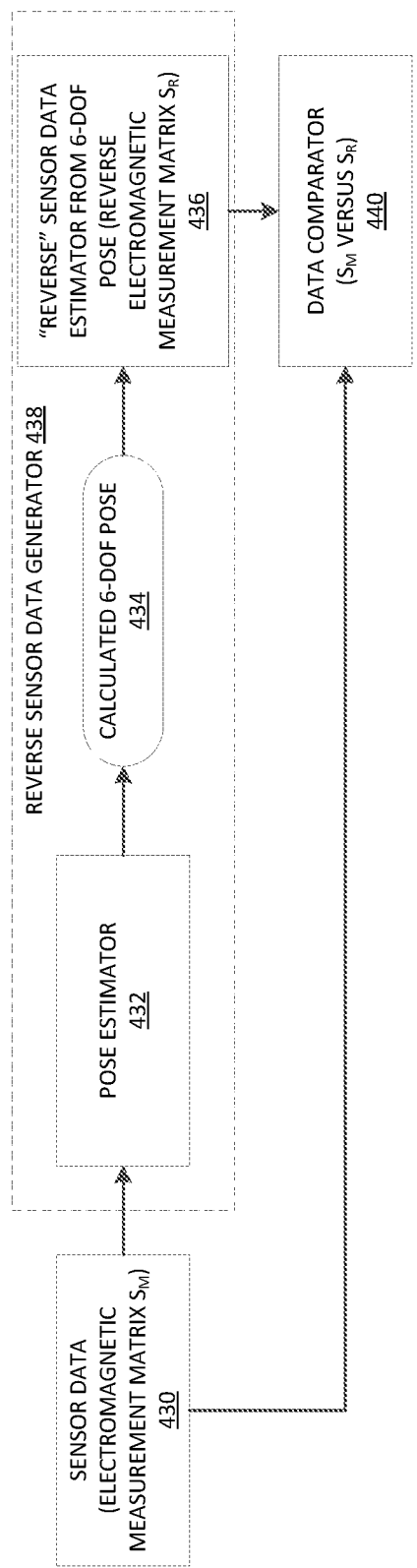
FIG. 14 is a process flow diagram that illustrates an embodiment of a reverse sensor data generator for calculating pose in an electromagnetic tracking system.

FIG. 14 is a process flow diagram that illustrates an example of a reverse sensor data generator for identifying lossy data in an electromagnetic tracking system. A sensor data pipeline may exist with sensor data (430) received from an electromagnetic sensor (for example, one or more of the electromagnetic sensors 404a, 404b, 604, 148, 150, 152, etc.). In some embodiments, the sensor data (430) may include noise, interference, or other inaccuracies. The sensor data (430) may comprise electromagnetic tracking data, such as received magnetic flux, induced currents, etc. from one or more sensor coils or similar structures. The sensor data (430) may be received or obtained as a matrix of sensor data described below. In some embodiments, the sensor data (430) may be similar or correspond to the sensor data (420) described herein.

For example, in some embodiments, the EM sensor may comprise an electromagnetic sensor device (604) and the EM sensor data may include an EM measurement matrix, $S_M$, used to determine pose of the EM sensor in the EM field generated by the EM emitter 402, 602. The EM measurement matrix, $S_M$, measured by the EM sensor is a 3×3 matrix (referred to with subscript "M" to represent that the matrix is measured by the EM sensor) and can include information relating the 6DOF pose of the EM sensor relative to the EM emitter.

The sensor data (430) may be passed to a pose estimator (432). In some embodiments, the pose estimator (432) may correspond to the pose estimator (422) described with reference to FIG. 12. The pose estimator (432) may comprise a hardware processor or the pose estimation may be performed by the local processing and data module (70), the remote processing module (72), or the controller 406. The pose estimator can generate a pose (434) of the EM sensor relative to the EM emitter based at least in part on the EM measurement matrix $S_M$. For example, the pose (434) can be a six (6) degree-of-freedom ("DOF") pose that includes a spatial position (e.g., Cartesian x, y, and z coordinates) and an angular orientation (e.g., yaw, pitch, and roll). In other implementations, fewer than six DOF may be generated by the pose estimator (432) or other spatial or angular coordinate representations can be used.

The generated 6-DOF pose (434) may include noise or error, because the lossy sensor data (430) includes noise, error, loss of precision, or inaccuracies. The reverse sensor generation techniques described herein can be used to reduce the lossiness of the sensor data.

Continuing with FIG. 14, the 6-DOF pose (434) calculated from the measured sensor data (e.g., the measured EM matrix $S_M$) may be an input to a reverse sensor data estimator (436) that takes the calculated 6-DOF pose and estimates an EM measurement matrix, $S_R$, that corresponds to the pose data. The EM measurement matrix, $S_R$, will be referred to as the "reverse" EM measurement matrix (and referenced with a subscript "R"), because it is, in effect, reverse-estimated from the calculated 6-DOF pose 434. The reverse EM measurement matrix can be calculated as the matrix that would result in generation of the calculated 6-DOF pose (434). The individual components of the 6-DOF pose (e.g., x, y, z, yaw, pitch, roll) can be used to estimate the nine components of the 3×3 reference EM measurement matrix, $S_R$.

A data comparator (440) can receive the reverse EM measurement matrix $S_R$ as estimated by the reverse estimator (436) and the EM measurement matrix $S_M$ measured by the EM sensors and compare the two matrices using optimization techniques (described further below with reference to block 442 of FIG. 15). The data comparator (440) may, for example, calculate a sum of squares of differences between corresponding elements of the two matrices $S_R$ and $S_M$ match, e.g., the sum of squares is less than a tolerance (such as below 5%, 1%, 0.1% or less). Other data comparison functions can be used such as, e.g., a maximum difference between elements, a sum of absolute values of differences between the elements, and so forth. The data comparator thus can reveal whether the estimated, reverse EM matrix $S_R$ substantially matches (e.g., to within the tolerance) the original, measured EM matrix $S_M$.

If the data comparator (440) determines there are differences between the reverse EM matrix and the estimated EM matrix, then the sensor data (430) may include noise or other inaccuracies, which can be reduced via the optimization process described below.

For future reference, in the embodiment shown in FIG. 14, the block of functions that constitute the sequence of actions by the pose estimator (432), the resulting calculated 6-DOF pose (434), and the reverse sensor data estimator (436) can be considered to constitute a unified whole: the reverse sensor data generator (438), which acts upon sensor data (430), and produces a reverse estimated version of that sensor data, after passing through the lossy step of the pose estimator (432).

Figure 15:
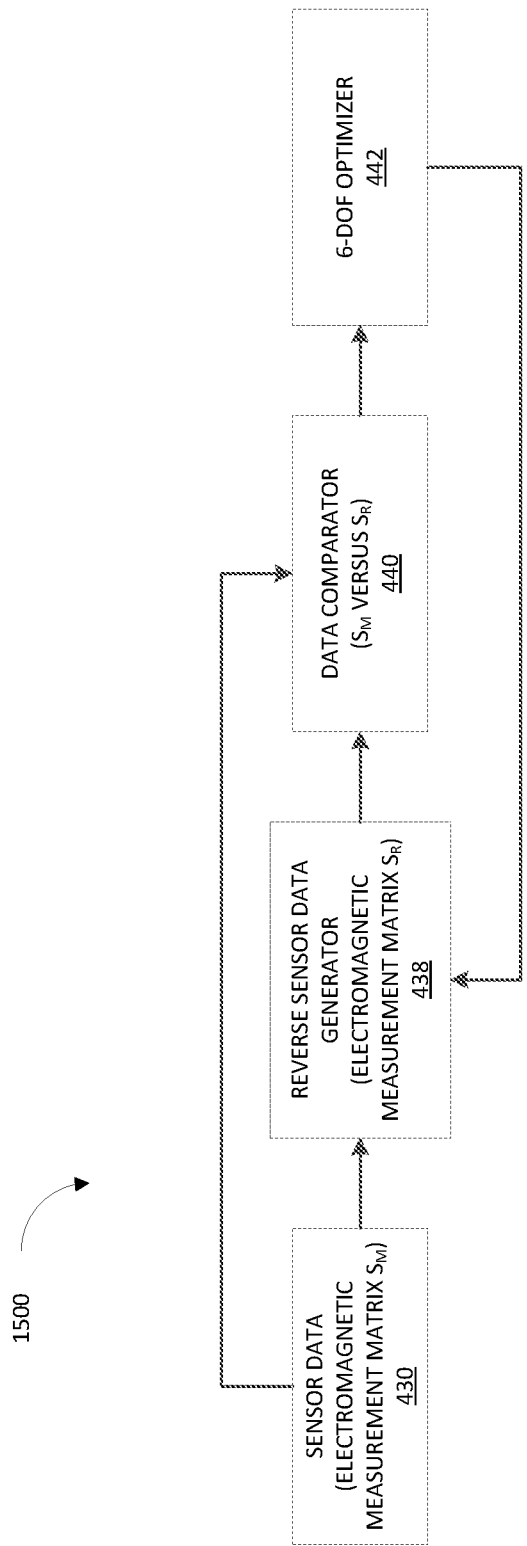
FIG. 15 is a process flow diagram that illustrates an embodiment of an optimization process for use with a reverse sensor data generator.

FIG. 15 is a process flow diagram 1500 that illustrates an example of an optimization process for improving calculations based on the lossy data identified by the reverse sensor data estimator (438) or the data comparator (440). The sensor data (430), the reverse sensor data generator (438), and the data comparator (440) have been described with reference to FIG. 14. FIG. 15 also includes a 6-DOF optimizer (442) that receives output from the data comparator (440).

The 6-DOF optimizer (442) can be used to improve the performance of the depicted sensor data pipeline that provides the sensor data (430) and the pose estimator (432), both of which may introduce lossy data.

The optimizer (440) can utilize an optimization algorithm such as, e.g., least squares, gradient descent, regression, and so forth to reduce the difference(s) between the reverse EM matrix and the measured EM matrix. For example, output from the 6-DOF optimizer (e.g., a new 6-DOF pose) can be fed back into the reverse sensor data generator (438), which can calculate a new value of the reverse EM measurement matrix, $S_R$, which is fed into the data comparator (440). If the difference between the new value of the reverse EM measurement matrix, $S_R$, and the measured EM measurement matrix, $S_M$, is below the threshold, then the process can cease, and the new 6-DOF pose represents an improvement over the original, estimated 6-DOF pose (e.g., the pose 434).

If the difference (e.g., calculated by the data comparator) between the new value of the reverse EM measurement matrix, $S_R$, and the measured EM measurement matrix, $S_M$, is above the threshold, the process can continue again to the 6-DOF optimizer (442), which can generate a new and further improved 6-DOF pose. The process can return to block 438 where the reverse sensor data generator can generate another reverse EM measurement matrix $S_R$, based on the further improved 6-DOF pose received from the 6-DOF optimizer (442).

Figure 16:
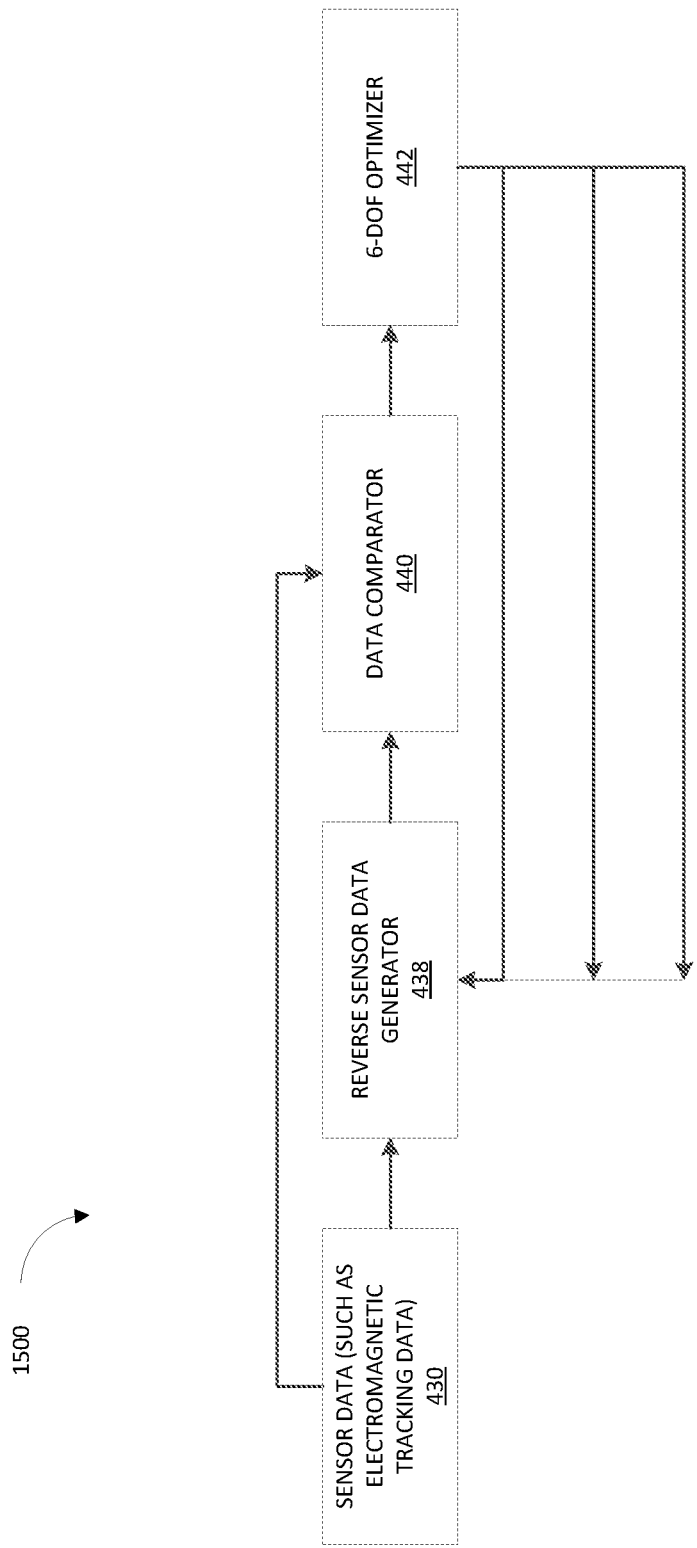
FIG. 16 is a process flow diagram that illustrates another embodiment of an optimization process for use with a reverse sensor data generator.

Thus, as illustrated in FIG. 16, the 6-DOF pose optimization process can be iterative, where blocks 438, 440, and 442 can be repeated until convergence occurs (e.g., the difference between $S_R$ and $S_M$ is sufficiently small, the difference between successive 6-DOF poses is sufficiently small, or a maximum number (e.g., 1, 2, 5, 10, 25, or more) of iterations occurs). In various implementations, whether the difference (found by the data comparator) is sufficiently small can depend on system requirements for pose estimation. For example, the threshold can be user-adjustable and set to provide a desired accuracy for pose estimation (e.g., pose errors smaller than a spatial tolerance or angular tolerance).

Accordingly, by feeding a current estimate of the 6-DOF pose back into the reverse sensor data generator (438), the difference between the sensor data (430), e.g., the measured EM sensor matrix $S_M$, and the reverse estimated sensor data, e.g., the reverse EM sensor matrix $S_R$, based on the improved or optimized 6-DOF pose may be reduced as compared to the difference between the sensor data (430) and the reverse estimated sensor data based on a previous estimate of the 6-DOF pose. Thus, the result from re-running the data comparator (440) between the original sensor data (430) and the new reverse estimated sensor data resulting from using the improved or optimized 6-DOF pose in the reverse sensor data generator (438) may further improve the 6-DOF pose (for example, remove some of the errors introduced by lossy data, etc.) as evidenced by the reduced difference determined by the data comparator (440). Thus, combining the 6-DOF optimizer (442) and the reverse sensor data generator (438) may indicate a better match (e.g., between $S_R$ and $S_M$) than was previously determined when comparing the original sensor data (430) with the first iteration of the reverse estimated sensor data. This better match may constitute a significant improvement on the estimated 6-DOF pose.

Example Sequential Optimization

Figure 17:
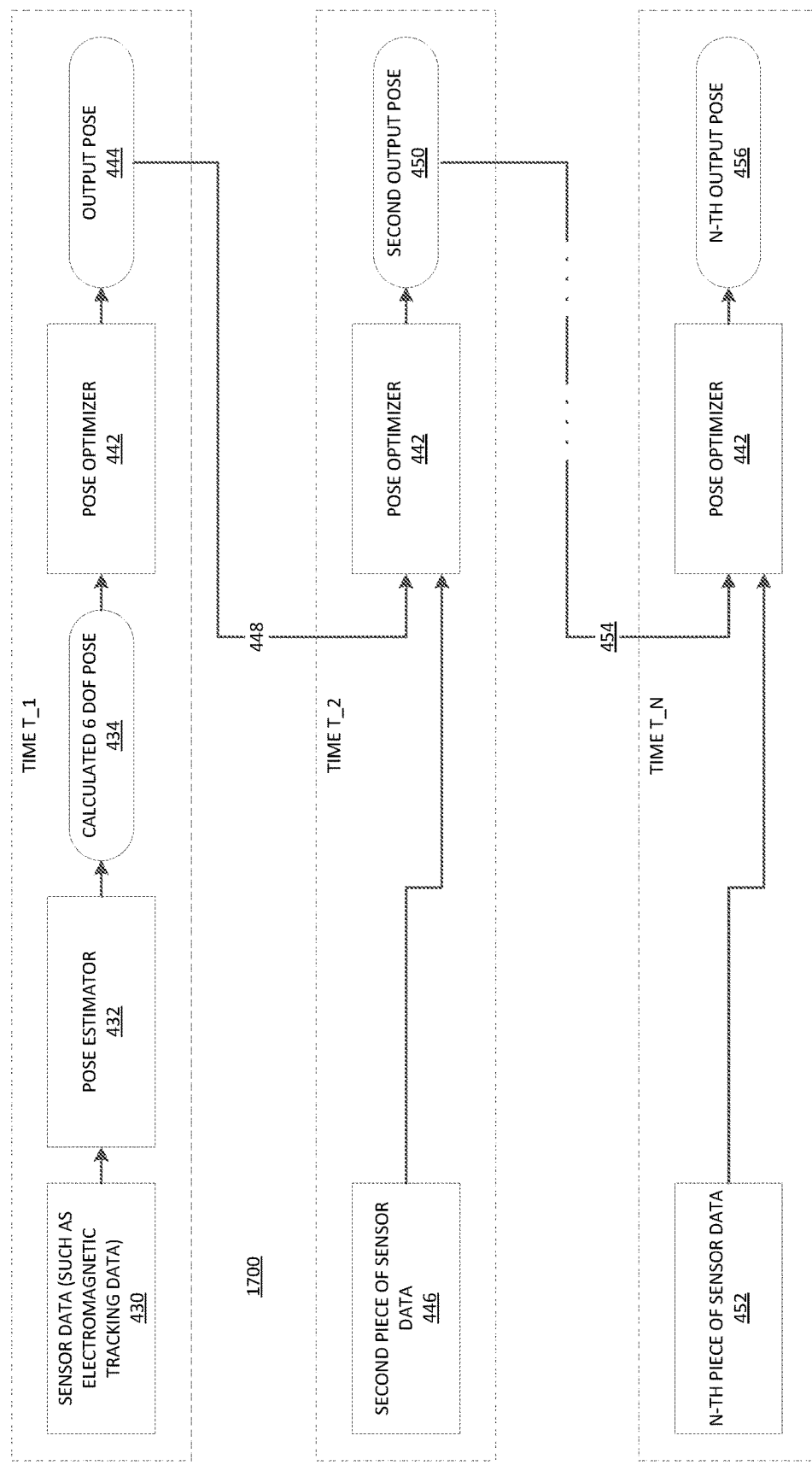
FIG. 17 is a process flow diagram that illustrates an example of sequentially processing successive sensor data using an optimized reverse sensor data generator.

FIG. 17 is a process flow diagram 1700 that illustrates an example of sequentially processing successive sensor data using the optimized reverse sensor data estimation techniques described with reference to FIGS. 14-16. The sequential technique can take pieces of sensor data received at different times and determine sequentially optimized poses based on the additional piece(s) of sensor data. Advantageously, rather than starting from "scratch", a previously determined pose can be used—with an additional piece of sensor data—to efficiently provide an improved pose. The process 1700 schematically illustrated in FIG. 17 can be applied during pose tracking by an EM tracking system, where pieces of sensor data are received continuously (or at a high frequency) while an object is being tracked (e.g., head pose or body pose of a user wearing an HMD).

FIG. 17 shows how data from a sensor (such as the electromagnetic sensors (404*a*, 404*b*, 604) may be sequentially processed as successive sensor data is received from the sensor(s). As shown, three illustrative times (Time T_1, Time T_2, and Time T_N) are depicted, where N corresponds to the number of pieces or sensor data (for example, number of successive sensor data) obtained from the sensor, where N can be any number greater than 1. There can be any number of pieces of sensor data received between time T_2 and time T_N.

In brief, at time T_1, a first block of the sensor data (430) obtained from the electromagnetic sensor is input to the pose estimator (432). The pose estimator (432) outputs a calculated 6-DOF pose to the 6-DOF pose optimizer (442) which generates an output pose (444). The pose optimizer (442) can include the reverse sensor data generator (438) and data comparator (44) described with reference to FIGS. 14-16. Thus, the pose optimizer (442) can apply the reverse sensor optimization techniques to provide an improved or optimized pose (444). The output pose (444) is then used as an input (448) at time T_2 for the pose optimizer (442) in combination with the second piece of sensor data (446). The output of the 6-DOF prose optimizer (442) at time T_2 is a second, improved or optimized output pose (450). The second output pose can be fed into the pose optimizer (442) with a third piece of sensor data to generate a third output pose and so on. For example, FIG. 17 shows a previous output pose fed to the pose optimizer (442) at time T_N, together with an N-th piece of sensor data (452) to generate the N-th improved or optimized output pose (456). The process 1700 can continue as long as additional pieces of sensor data are received. Note that at subsequent times T_2 ... T_N, the pose estimator (432) is not executed again (as it was at time T_1), because the output pose from the previous time provides a good estimate to the pose optimizer (442), if the time increments between successive pieces of sensor data are sufficiently short.

Referring again to FIG. 17, at a time T_1, considered, without loss of generality, to be any time that the EM tracking system is initialized, the sensor data (430) may be passed into the pose estimator (432) to produce a calculated 6-DOF pose (434) to be used as an initial point for the pose optimizer (442) to operate on in order to produce an output pose (444). The pose optimizer (442) may, in some implementations, apply the reverse sensor optimization techniques described with reference to FIGS. 14 to 16 to generate the output pose (444).

Subsequently, at time T_2, a second piece of sensor data (446) is obtained and may be passed directly to the pose optimizer (442), in conjunction with the output pose from time T_1 (444). Thus, the output pose from time T_1 (444) may be used as the initial pose (448) for the pose optimizer (442) at time T_2, eliminating the need to re-run the pose estimator (432) (as initially run at time T_1), when generating the second output pose (450).

The process illustrated in FIG. 17 can continue while additional pieces of sensor data are received. For example, at future times T_N, (where N is greater than 2 for the purpose of FIG. 17), the same approach may be taken, by combining the N-th piece of sensor data (452) with the output pose from the previous time step (454) as inputs to the pose optimizer (442) in producing the N-th output pose (456). By reusing the output pose from the preceding time (e.g., time T_(N−1)) when generating the output pose at time T_N, processing and other overhead and complexities may be reduced or avoided.

The sequential approach described with reference to FIG. 17 may advantageously be used when the time difference (delta_T=T_N−T_(N−1)) between successive pieces of sensor data is sufficiently small that the object whose pose is being tracked (for example, the head) undergoes only a small change to its ground truth 6-DOF pose. This typically applies during continuous (or high frequency) pose tracking, where the time difference delta_T is short compared to the time over which object movement occurs (or, equivalently, the frequency corresponding to delta_T (1/delta_T) is large compared to the frequency at which object movement occurs). For example, head movements typically occur at frequencies below a few to ten Hz, and the sequential techniques can be advantageously applied if the sensor readout frequency is greater than about 20 Hz to 50 Hz. Thus, when the time difference delta_T is less than a threshold value, the methods described herein may be implemented to improve the output pose, as the output pose from time T_(N−1) will tend to be closer to the true pose at time T_N.

Example Method for Generating an Optimized Pose

Figure 18:
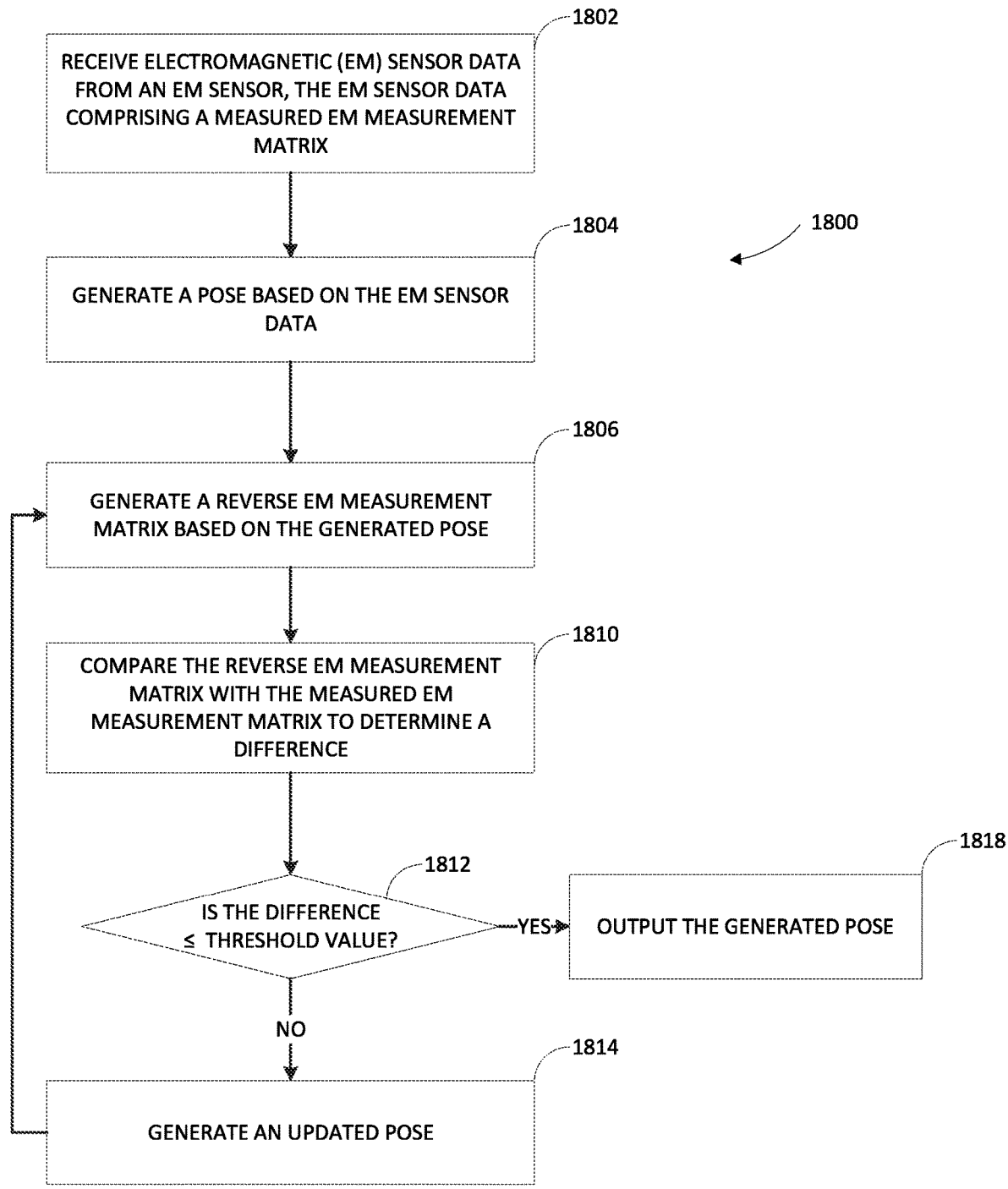
FIG. 18 is a flowchart that illustrates an example of a method for estimating pose in an electromagnetic tracking system.

FIG. 18 is a flowchart that illustrates an example of a method 1800 of using a reverse sensor data estimation process in an electromagnetic tracking system to generate an improved or optimized pose. The method 1800 can be performed by the controller 406 using data from the EM field sensors 404a, 404b described with reference to FIG. 4. In an AR or VR application, the local processing & data module 70 or the remote processing module 72 (or other hardware controller) may perform the method using data from the EM field sensors 604 described with reference to FIG. 6.

At block 1802, electromagnetic (EM) sensor data is received from EM sensors (such as the sensors 404a, 404b, 604). The EM sensor data can comprise the measured EM measurement matrix $S_M$ described above.

At block 1804, a pose is estimated based on the received EM sensor data. In some embodiments, the pose is estimated by the pose estimator (432). The pose can correspond to the calculated 6-DOF pose (434) described above. For example, the pose can be a 6-DOF pose that includes a spatial position (e.g., Cartesian x, y, and z coordinates) and an angular orientation (e.g., yaw, pitch, and roll). In other implementations, fewer than six DOF may be generated by the pose estimator or other spatial or angular coordinate representations can be used.

At block 1806, the reverse EM measurement matrix, $S_R$, is generated based on the pose received from block 1804 (or from block 1814 described below). The reverse EM measurement matrix can be calculated as the matrix that would result in generation of the pose received at this block. The individual components of the received pose (e.g., x, y, z, yaw, pitch, roll) can be used to estimate the nine components of the 3×3 reference EM measurement matrix, $S_R$.

At block 1810, the method 1800 compares the reverse EM measurement matrix, $S_R$, with the measured EM measurement matrix, $S_M$, to determine a difference between these matrices. In some embodiments, the difference may be determined based on subtracting each value in the reverse EM measurement matrix from the corresponding value in the measured EM measurement matrix, squaring, and then summing these values.

Because the EM sensors that generate the EM sensor data are not ideal and include some amount of lossiness, the EM sensor data and the reverse EM measurement data generally will not be the same. At block 1812, the method 1800 determines whether the difference between the matrices $S_R$ and $S_M$ is above or below a threshold. For example, the threshold may represent a relative difference of 5%, 1%, 0.1%, or lower. If the difference is below the threshold, the generated pose may be considered to be acceptably accurate, and the method 1800 moves to block 1818 where the pose is output. Thus, the method 1800 provides an optimized pose.

In contrast, if the difference between the matrices exceeds the threshold value, then the difference may be too high to deem the estimated pose sufficiently accurate, and the method 1800 continues to block 1814, where an updated pose based on the reverse EM measurement matrix is generated. The pose generated at block 1814 is typically an improvement over the previous pose. The method then returns to block 1806 where a new reverse EM measurement matrix, $S_R$, is generated. The blocks 1806, 1810, 1812, and 1814 can be iterated until the reverse matrix $S_R$ and the measured matrix $S_M$ are sufficiently close (at block 1812) to indicate the optimization process has converged. The optimized pose is output at block 1818.

Additional Aspects

In in a first aspect, an augmented reality display system comprising: a display configured to project virtual images to eyes of a wearer; a frame configured to mount the display in front of the eyes of the wearer; an electromagnetic (EM) field emitter configured to generate a magnetic field; an EM sensor configured to sense the magnetic field and provide EM sensor data, wherein one of the EM field emitter or the EM sensor is mechanically coupled to the frame and the other of the EM field emitter or the EM sensor is mechanically coupled to a component of the augmented reality display system that is independently movable relative to the frame; a hardware processor programmed to: receive EM sensor data from the EM sensor, the EM sensor data comprising a measured EM measurement matrix; estimate a six degrees-of-freedom (6-DOF) pose based at least in part on the measured EM measurement matrix; generate a reverse EM measurement matrix based at least in part on the six-DOF pose; perform an optimization to reduce a difference between the reverse EM measurement matrix and the measured EM measurement matrix; and generate an optimized 6-DOF pose based in part on the optimization.

In a second aspect, the augmented reality display system of aspect 1, wherein the measured EM measurement matrix and the reverse EM measurement matrix comprise 3×3 matrices.

In a third aspect, the augmented reality display system of aspect 1 or aspect 2, wherein the 6-DOF pose comprises three spatial coordinates and three angular coordinates.

In a fourth aspect, the augmented reality display system of any one of aspects 1 to 3, wherein to perform the optimization, the hardware processor is programmed to apply a least squares algorithm, a gradient descent algorithm, or a regression algorithm.

In a fifth aspect, the augmented reality display system of any one of aspects 1 to 4, wherein the hardware processor is further programmed to: receive second EM sensor data from the EM sensor; and utilize the second EM sensor data and the optimized 6-DOF pose to generate a second optimized 6-DOF pose.

In a sixth aspect, the augmented reality display system of aspect 5, wherein the hardware processor is further programmed to: receive third EM sensor data from the EM sensor; and utilize the third EM sensor data and the second optimized 6-DOF pose to generate a third optimized 6-DOF pose.

In a seventh aspect, the augmented reality display system of any one of aspects 1 to 6, wherein: the component of the augmented reality display system comprises a user-input totem or a belt pack, the EM sensor is mechanically coupled to the frame, and the EM field emitter is mechanically coupled to the user-input totem or the belt pack.

In an eighth aspect, an augmented reality display system comprising: an electromagnetic (EM) field emitter configured to generate a magnetic field; an EM sensor configured to sense the magnetic field and provide EM sensor data, a hardware processor programmed to: receive the EM sensor data from the EM sensor, the EM sensor data comprising a measured EM measurement matrix; calculate a pose; generate a reverse EM measurement matrix based at least in part on the pose; perform an optimization to reduce a difference between the reverse EM measurement matrix and the measured EM measurement matrix; and generate an optimized pose based in part on the optimization.

In a ninth aspect, the augmented reality display system of aspect 8, wherein the pose or the optimized pose comprises a six degree-of-freedom (6-DOF) pose.

In a 10th aspect, the augmented reality display system of aspect 9, wherein to perform the optimization, the hardware processor is programmed to iterate until the difference is below a threshold.

In an 11th aspect, the augmented reality display system of any one of aspects 8 to 10, wherein the hardware processor is further programmed to: receive second EM sensor data from the EM sensor; and utilize the second EM sensor data and the optimized pose to generate a second optimized pose.

In a 12th aspect, the augmented reality display system of any one of aspects 8 to 11, wherein the hardware processor is further programmed to: receive non-EM sensor data from a non-EM sensor; and fuse the non-EM sensor data and the optimized pose to generate a second optimized pose.

In a 13th aspect, the augmented reality display system of aspect 12, where the non-EM sensor data is received from an inertial measurement unit (IMU).

In a 14th aspect, a method for estimating pose of an electromagnetic (EM) sensor in an EM tracking system, the method comprising: receiving a measured EM measurement matrix measured by the EM sensor; calculating a pose of the EM sensor; generating, based at least partly on the pose, a reverse EM measurement matrix; decreasing a difference between the reverse EM measurement matrix and the measured EM measurement matrix; and generating an improved pose of the EM sensor.

In a 15th aspect, the method of aspect 14, wherein the pose or the improved pose comprise a six degree-of-freedom (6-DOF) pose.

In a 16th aspect, the method of aspect 14 or aspect 15, wherein decreasing the difference between the reverse EM measurement matrix and the measured EM measurement matrix comprises applying an optimization algorithm.

In a 17th aspect, the method of aspect 16, wherein the optimization algorithm comprises least squares, regression, or gradient descent.

In an 18th aspect, an electromagnetic tracking system comprising: an EM emitter configured to generate a magnetic field; an EM sensor configured to sense the magnetic field; and a hardware processor programmed to perform the method of any one of aspects 14 to 17.

In a 19th aspect, an augmented reality display system comprising the electromagnetic tracking system of aspect 18.

Additional Considerations

Although certain embodiments of the reverse sensor data generation technology are described in the context of pose determination for components of a wearable display system (e.g., EM sensors for tracking head pose or body pose), this is for illustration and not limitation. Embodiments of the reverse sensor data generation technology can be used in other applications and with other devices and in general can be applied to any EM tracking system.

Each of the processes, methods, and algorithms described herein and/or depicted in the attached figures may be embodied in, and fully or partially automated by, code modules executed by one or more physical computing systems, hardware computer processors, application-specific circuitry, and/or electronic hardware configured to execute specific and particular computer instructions. For example, computing systems can include general purpose computers (e.g., servers) programmed with specific computer instructions or special purpose computers, special purpose circuitry, and so forth. A code module may be compiled and linked into an executable program, installed in a dynamic link library, or may be written in an interpreted programming language. In some implementations, particular operations and methods may be performed by circuitry that is specific to a given function.

Further, certain implementations of the functionality of the present disclosure are sufficiently mathematically, computationally, or technically complex that application-specific hardware or one or more physical computing devices (utilizing appropriate specialized executable instructions) may be necessary to perform the functionality, for example, due to the volume or complexity of the calculations involved or to provide results substantially in real-time. For example, a video may include many frames, with each frame having millions of pixels, and specifically programmed computer hardware is necessary to process the video data to provide a desired image processing task or application in a commercially reasonable amount of time. Further, pose estimation using electromagnetic tracking typically needs to be done in real time in an AR or VR environment and hardware processing is required to perform the pose estimation task to provide an enjoyable user experience.

Code modules or any type of data may be stored on any type of non-transitory computer-readable medium, such as physical computer storage including hard drives, solid state memory, random access memory (RAM), read only memory (ROM), optical disc, volatile or non-volatile storage, combinations of the same and/or the like. The methods and modules (or data) may also be transmitted as generated data signals (e.g., as part of a carrier wave or other analog or digital propagated signal) on a variety of computer-readable transmission mediums, including wireless-based and wired/cable-based mediums, and may take a variety of forms (e.g., as part of a single or multiplexed analog signal, or as multiple discrete digital packets or frames). The results of the disclosed processes or process steps may be stored, persistently or otherwise, in any type of non-transitory, tangible computer storage or may be communicated via a computer-readable transmission medium.

Any processes, blocks, states, steps, or functionalities in flow diagrams described herein and/or depicted in the attached figures should be understood as potentially representing code modules, segments, or portions of code which include one or more executable instructions for implementing specific functions (e.g., logical or arithmetical) or steps in the process. The various processes, blocks, states, steps, or functionalities can be combined, rearranged, added to, deleted from, modified, or otherwise changed from the illustrative examples provided herein. In some embodiments, additional or different computing systems or code modules may perform some or all of the functionalities described herein. The methods and processes described herein are also not limited to any particular sequence, and the blocks, steps, or states relating thereto can be performed in other sequences that are appropriate, for example, in serial, in parallel, or in some other manner. Tasks or events may be added to or removed from the disclosed example embodiments. Moreover, the separation of various system components in the implementations described herein is for illustrative purposes and should not be understood as requiring such separation in all implementations. It should be understood that the described program components, methods, and systems can generally be integrated together in a single computer product or packaged into multiple computer products. Many implementation variations are possible.

The processes, methods, and systems may be implemented in a network (or distributed) computing environment. Network environments include enterprise-wide computer networks, intranets, local area networks (LAN), wide area networks (WAN), personal area networks (PAN), cloud computing networks, crowd-sourced computing networks, the Internet, and the World Wide Web. The network may be a wired or a wireless network or any other type of communication network.

The invention includes methods that may be performed using the subject devices. The methods may comprise the act of providing such a suitable device. Such provision may be performed by the end user. In other words, the "providing" act merely requires the end user obtain, access, approach, position, set-up, activate, power-up or otherwise act to provide the requisite device in the subject method. Methods recited herein may be carried out in any order of the recited events which is logically possible, as well as in the recited order of events.

The systems and methods of the disclosure each have several innovative aspects, no single one of which is solely responsible or required for the desirable attributes disclosed herein. The various features and processes described above may be used independently of one another, or may be combined in various ways. All possible combinations and subcombinations are intended to fall within the scope of this disclosure. Various modifications to the implementations described in this disclosure may be readily apparent to those skilled in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein.

Certain features that are described in this specification in the context of separate implementations also can be implemented in combination in a single implementation. Conversely, various features that are described in the context of a single implementation also can be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination. No single feature or group of features is necessary or indispensable to each and every embodiment.

Conditional language used herein, such as, among others, "can," "could," "might," "may," "e.g.," and the like, unless specifically stated otherwise, or otherwise understood within the context as used, is generally intended to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without author input or prompting, whether these features, elements and/or steps are included or are to be performed in any particular embodiment. The terms "comprising," "including," "having," and the like are synonymous and are used inclusively, in an open-ended fashion, and do not exclude additional elements, features, acts, operations, and so forth. Also, the term "or" is used in its inclusive sense (and not in its exclusive sense) so that when used, for example, to connect a list of elements, the term "or" means one, some, or all of the elements in the list. In addition, the articles "a," "an," and "the" as used in this application and the appended claims are to be construed to mean "one or more" or "at least one" unless specified otherwise. Except as specifically defined herein, all technical and scientific terms used herein are to be given as broad a commonly understood meaning as possible while maintaining claim validity.

As used herein, a phrase referring to "at least one of" a list of items refers to any combination of those items, including single members. As an example, "at least one of: A, B, or C" is intended to cover: A, B, C, A and B, A and C, B and C, and A, B, and C. Conjunctive language such as the phrase "at least one of X, Y and Z," unless specifically stated otherwise, is otherwise understood with the context as used in general to convey that an item, term, etc. may be at least one of X, Y or Z. Thus, such conjunctive language is not generally intended to imply that certain embodiments require at least one of X, at least one of Y and at least one of Z to each be present.

Similarly, while operations may be depicted in the drawings in a particular order, it is to be recognized that such operations need not be performed in the particular order shown or in sequential order, or that all illustrated operations be performed, to achieve desirable results. Further, the drawings may schematically depict one more example processes in the form of a flowchart. However, other operations that are not depicted can be incorporated in the example methods and processes that are schematically illustrated. For example, one or more additional operations can be performed before, after, simultaneously, or between any of the illustrated operations. Additionally, the operations may be rearranged or reordered in other implementations. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products. Additionally, other implementations are within the scope of the following claims. In some cases, the actions recited in the claims can be performed in a different order and still achieve desirable results.

What is claimed is:

1. An augmented reality display system comprising:
a display configured to project virtual images to eyes of a wearer;
a frame configured to mount the display in front of the eyes of the wearer; and
a hardware processor programmed to:
receive EM sensor data from an EM sensor configured to sense a magnetic field generated by an EM field emitter, wherein one of the EM field emitter or the EM sensor is mechanically coupled to the frame and the other of the EM field emitter or the EM sensor is mechanically coupled to a component of the augmented reality display system that is independently movable relative to the frame, the EM sensor data comprising a measured EM measurement matrix;
estimate a six degrees-of-freedom (6-DOF) pose based at least in part on the measured EM measurement matrix;
generate a reverse EM measurement matrix based at least in part on the six-DOF pose;
perform an optimization to reduce a difference between the reverse EM measurement matrix and the measured EM measurement matrix; and
generate an optimized 6-DOF pose based in part on the optimization.

2. The augmented reality display system of claim 1, wherein the measured EM measurement matrix and the reverse EM measurement matrix comprise 3×3 matrices.

3. The augmented reality display system of claim 1, wherein the 6-DOF pose comprises three spatial coordinates and three angular coordinates.

4. The augmented reality display system of claim 1, wherein to perform the optimization, the hardware processor is programmed to apply a least squares algorithm, a gradient descent algorithm, or a regression algorithm.

5. The augmented reality display system of claim 1, wherein the hardware processor is further programmed to:
receive second EM sensor data from the EM sensor; and
utilize the second EM sensor data and the optimized 6-DOF pose to generate a second optimized 6-DOF pose.

6. The augmented reality display system of claim 5, wherein the hardware processor is further programmed to:
receive third EM sensor data from the EM sensor; and
utilize the third EM sensor data and the second optimized 6-DOF pose to generate a third optimized 6-DOF pose.

7. The augmented reality display system of claim 1, wherein the component of the augmented reality display system comprises a user-input totem or a belt pack.

8. A hardware processor for an augmented reality display system, programmed to:
receive EM sensor data from an EM sensor, the EM sensor data comprising a measured EM measurement matrix;
calculate a pose;
generate a reverse EM measurement matrix based at least in part on the pose;
perform an optimization to reduce a difference between the reverse EM measurement matrix and the measured EM measurement matrix; and
generate an optimized pose based in part on the optimization.

9. The hardware processor for the augmented reality display system of claim 8, wherein the pose or the optimized pose comprises a six degree-of-freedom (6-DOF) pose.

10. The hardware processor for the augmented reality display system of claim 9, wherein to perform the optimization, the hardware processor is programmed to iterate until the difference is below a threshold.

11. The hardware processor for the augmented reality display system of claim 8, wherein the hardware processor is further programmed to:
receive second EM sensor data from the EM sensor; and
utilize the second EM sensor data and the optimized pose to generate a second optimized pose.

12. The hardware processor for the augmented reality display system of claim 8, wherein the hardware processor is further programmed to:
receive non-EM sensor data from a non-EM sensor; and
fuse the non-EM sensor data and the optimized pose to generate a second optimized pose.

13. The hardware processor for the augmented reality display system of claim 12, where the non-EM sensor data is received from an inertial measurement unit (IMU).

14. A method for estimating pose of an electromagnetic (EM) sensor in an EM tracking system, the method comprising:
calculating a pose of the EM sensor based on an EM measurement matrix measured by the EM sensor;
generating, based at least partly on the pose, a reverse EM measurement matrix; and
generating an improved pose of the EM sensor based, at least in part, on a difference between the reverse EM measurement matrix and the measured EM measurement matrix.

15. The method of claim 14, wherein the pose or the improved pose comprise a six degree-of-freedom (6-DOF) pose.

16. The method of claim 14, wherein decreasing the difference between the reverse EM measurement matrix and the measured EM measurement matrix comprises applying an optimization algorithm.

17. The method of claim 16, wherein the optimization algorithm comprises least squares, regression, or gradient descent.

18. An electromagnetic tracking system comprising:
an EM emitter configured to generate a magnetic field;
an EM sensor configured to sense the magnetic field; and
a hardware processor programmed to perform the method of claim 14.

* * * * *